(12) United States Patent
Perez et al.

(10) Patent No.: US 7,039,496 B2
(45) Date of Patent: May 2, 2006

(54) COMPRESSION UTILITY FOR USE WITH SMART LABEL PRINTING AND PRE-LOADING

(75) Inventors: Juan R. Perez, Richardson, TX (US); Duane Anderson, Cockeysville, MD (US); David Potteiger, Pasadena, MD (US); Michael Burgess, Fairlawn, NJ (US)

(73) Assignee: United Parcel Services of America, Inc., Atlanta, GA (US)

( * ) Notice: Subject to any disclaimer, the term of this patent is extended or adjusted under 35 U.S.C. 154(b) by 942 days.

(21) Appl. No.: 10/015,541

(22) Filed: Dec. 11, 2001

(65) Prior Publication Data

US 2002/0135802 A1    Sep. 26, 2002

Related U.S. Application Data

(60) Provisional application No. 60/254,661, filed on Dec. 11, 2000.

(51) Int. Cl.
*G06F 7/00*    (2006.01)

(52) U.S. Cl. ............... 700/213; 700/225; 235/385; 705/28

(58) Field of Classification Search .......... 700/213, 700/214, 225, 226, 2; 705/28; 235/385
See application file for complete search history.

(56) References Cited

U.S. PATENT DOCUMENTS

| | | |
|---|---|---|
| 4,876,541 A | 10/1989 | Storer |
| 4,959,785 A | 9/1990 | Yamamoto et al. |
| 5,292,004 A | 3/1994 | Cesarini |
| 5,325,303 A | 6/1994 | Walz et al. |
| 5,472,097 A | 12/1995 | Villachica |
| 5,506,580 A | 4/1996 | Whiting et al. |
| 5,532,694 A | 7/1996 | Mayers et al. |
| 5,593,267 A | 1/1997 | McDonald et al. |
| 5,764,774 A | 6/1998 | Liu |
| 5,778,377 A | 7/1998 | Marlin et al. |
| 5,780,778 A | 7/1998 | Schwartz et al. |
| 5,790,429 A | 8/1998 | Baker et al. |
| 5,822,739 A | 10/1998 | Kara |
| 5,855,006 A | 12/1998 | Huemoeller et al. |
| 5,869,819 A | 2/1999 | Knowles et al. |
| 5,905,232 A | 5/1999 | Schwartz et al. |
| 5,948,040 A | 9/1999 | DeLorme et al. |
| 5,971,587 A | 10/1999 | Kato et al. |
| 5,992,753 A | 11/1999 | Xu |
| 5,995,118 A | 11/1999 | Masuda |
| 5,995,950 A | 11/1999 | Barns-Slavin et al. |
| 6,018,715 A | 1/2000 | Lynch et al. |
| 6,061,398 A | 5/2000 | Satoh et al. |
| 6,173,209 B1 | 1/2001 | Laval et al. |
| 6,175,826 B1 | 1/2001 | Malandra, Jr. et al. |
| 6,189,702 B1 | 2/2001 | Bonnet |
| 6,208,980 B1 | 3/2001 | Kara |
| 6,241,099 B1 | 6/2001 | Hendrickson et al. |
| 6,329,919 B1 | 12/2001 | Boies et al. |
| 6,529,786 B1 | 3/2003 | Sim |
| 6,731,940 B1 | 5/2004 | Nagendran |

(Continued)

*Primary Examiner*—Khoi H. Tran
(74) *Attorney, Agent, or Firm*—Alston & Bird, LLP

(57) ABSTRACT

Systems and Methods for electronically capturing a destination address of a package and using the destination address to automate a package pre-load operation. Compressing the destination address as a compressed Maxicode symbol. Generating a shipping label with a compressed Maxicode and a pre-load assist system for generating package handling instructions from the electronically captured destination address.

11 Claims, 22 Drawing Sheets

U.S. PATENT DOCUMENTS

| | | |
|---|---|---|
| 6,885,991 B1 | 4/2005 | Skonberg et al. |
| 6,889,194 B1 * | 5/2005 | Kadaba .................. 705/1 |
| 2002/0010604 A1 | 1/2002 | Block |
| 2002/0156661 A1 | 10/2002 | Jones et al. |
| 2003/0010822 A1 | 1/2003 | Davies et al. |
| 2003/0040946 A1 | 2/2003 | Sprenger et al. |
| 2003/0055689 A1 | 3/2003 | Block et al. |
| 2003/0055690 A1 | 3/2003 | Garback |
| 2003/0109266 A1 | 6/2003 | Rafiah et al. |
| 2003/0120526 A1 | 6/2003 | Altman et al. |

\* cited by examiner

Table 1 ANSI-Compliant Interface Specification (Compressor Input)

| FIELD NAME | MAX SIZE (BYTES) & TYPE | OPTIONAL |
|---|---|---|
| Message Header 1)>Rs | 4 | |
| Format 01 Header 01 Gs96 | 5 | |
| Ship to Postal Code | Mode 2, 9N Mode 3, 6AN | |
| Field Separator Gs | 1 | |
| Ship to ISO Country Code | 3N | |
| Field Separator Gs | 1 | |
| Class of Service | 3N | |
| Field Separator Gs | 1 | |
| Tracking Number | 10AN | |
| Field Separator Gs | 1 | |
| Origin Carrier SCAC UPSN | 4 | |
| Field Separator Gs | 1 | X |
| Shipper ID | 6AN | |
| Field Separator Gs | 1 | |
| Julian Date of Pickup | N3 | |
| Field Separator Gs | 1 | |
| Shipment ID | ANO. 30 | |
| Field Separator Gs | 1 | |
| Shipment N of X | NO. 3/NO. 3 | |
| Field Separator Gs | 1 | |
| Weight | NO. 10 | |
| Field Separator Gs | 1 | |
| Address Validation (Y/N) | 1 | |
| Field Separator Gs | 1 | |
| Ship To Address | ANO. 35 | |
| Field Separator Gs | 1 | |
| Ship To City | A0. 35 | |
| Field Separator Gs | 1 | |
| Ship To State | A2 | |
| Format Trailer Rs | 1 | |
| Format 05 Header | 2 | |
| Field Separator Gs | 1 | |
| Ship To Address Line 2 Application Identifier (201) | AN3 + ANO. 35 | |
| Field Separator Gs | 1 | |
| Ship To Address Line 3 Application Identifier (211) | AN3 + ANO. 35 | |
| Field Separator Gs | 1 | |
| Ship To Address Line 4 Application Identifier (22L) | AN3 + ANO. 35 | |
| Field Separator Gs | 1 | |
| Ship To Address Line 5 Application Identifier (23L) | AN3 + ANO. 35 | |
| Format Trailer (Rs) | 1 | |
| Message Trailor Lot | 1 | |

FIG. 2

Package Info:  Music Corp
Attn: Sam Smith
Room 202, Music Dept
813 Main St
Shaumburg, IL 12345
Country Code: 001
Class of Service: 001
Tracking Number: 1Z12345675
Shipper ID: 123456
Julian Date of Year: 123
Weight: 1lb
City/State/Postal Code have been validated

Fig. 3A

[)>Rs
01Gs96123450000Gs001Gs001Gs1Z12345675GsUPSNGs123456
Gs123GsGs1/1Gs1GsY
Gs813 MAIN STGsSHAUMBURGGsILRs
05Gs20LROOM 202Gs21LMUSIC DEPTGs22LMUSIC
CORPGs23LSAM SMITHRs
Eot

{ "88", 0000000000000000000000000001000b, 11, 0, 24 },
{ "89", 0000000000000000000111011001011b, 12, 0, 26 },
{ "9", 0000000000000000000000010001010b, 14, 0, 0 },
{ "90", 0000000000000000000001011000011b, 10, 0, 28 },
{ "91", 0000000000000000000010111001000b, 11, 0, 30 },
{ "92", 0000000000000000000010001001101b, 11, 0, 25 },
{ "93", 0000000000000000000000101101011b, 11, 0, 25 },
{ "94", 0000000000000000000000100011011b, 11, 0, 26 },
{ "95", 0000000000000000000010110011011b, 11, 0, 26 },
{ "96", 0000000000000000000000000010011b, 11, 0, 26 },
{ "97", 0000000000000000000111100010001b, 12, 0, 31 },
{ "98", 0000000000000000000000100010110b, 11, 0, 26 },
{ "99", 0000000000000000000000010001110b, 11, 0, 28 },
{ "A", 00000000000000000000000000111111b, 6, 0, 0 },
{ "AI", 0000000000000000000000111101100b, 9, 0, 12 },
{ "ALL", 0000000000000000000001010011000b, 10, 0, 16 },
{ "ALY", 00000000000000000100010010001110b, 15, 0, 18 },
{ "AN", 0000000000000000000000000011100b, 7, 0, 12 },
{ "AND", 0000000000000000000001010011010b, 10, 0, 18 },
{ "ANY", 0000000000000000000010110001001b, 11, 0, 19 },
{ "APT", 00000000000000000000101100010001b, 12, 0, 22 },
{ "AR", 0000000000000000000000001010111b, 7, 0, 13 },
{ "ARC", 00000000000000000000100001111001b, 12, 0, 19 },
{ "AT", 0000000000000000000000010101100b, 8, 0, 14 },
{ "ATTN", 0000000000000000000000011111100b, 11, 0, 28 },
{ "AU", 0000000000000000000001011000101b, 10, 0, 13 },
{ "AUTO", 0000000000000000000000010011001b, 11, 0, 27 },
{ "AVE", 0000000000000000000000101100010b, 8, 0, 20 },
{ "B", 00000000000000000000000001111001b, 7, 0, 0 },
{ "BCH", 000000000000000010110101011 1001b, 17, 0, 20 },
{ "BL", 0000000000000000000001011100101b, 10, 0, 12 },
{ "BLDG", 00000000000000000000101100001001b, 12, 0, 25 },
{ "BLVD", 0000000000000000000000000000011b, 9, 0, 26 },
{ "BOX", 0000000000000000000001000001000b, 10, 0, 21 },
{ "BR", 0000000000000000000000100111100b, 9, 0, 14 },
{ "BRG", 0000000000000001000100100001111010b, 18, 0, 21 },
{ "BRK", 00000000000000000001000100111001b, 19, 0, 21 },
{ "BRKS", 00000000110110100110100101000011b, 25, 0, 27 },
{ "BSMT", 000000000011110110100001 00100011b, 22, 0, 27 },
{ "BYP", 00000000000000000000000100010010b, 15, 0, 22 },
{ "C", 0000000000000000000000000100001b, 6, 0, 0 },
{ "C/O", 00000000000000000000100111110101b, 12, 0, 22 },
{ "CE", 000000000000000000000000000101100b, 8, 0, 12 },
{ "CENT", 0000000000000000000001110001110b, 10, 0, 26 },
{ "CIR", 00000000000000000000111100010000b, 12, 0, 19 },
{ "CIRS", 00000000000000100010011100000011b, 23, 0, 25 },
{ "CITY", 000000000000000000001101111011b, 12, 0, 27 },
{ "CK", 0000000000000000000000101101110b, 9, 0, 13 },
{ "CO", 0000000000000000000000000000010b, 7, 0, 12 },
{ "COMP", 00000000000000000000000010001010b, 10, 0, 26 },
{ "COR", 0000000000000000000000001011101b, 11, 0, 19 },
{ "CORP", 00000000000000000000000010001111b, 10, 0, 27 },

Fig. 4C

{ "CORS", 0000000000000111101101000010011b, 18, 0, 25 },
{ "CPE", 0000000000000000001000100100000b, 13, 0, 20 },
{ "CRES", 0000000000000000001001111101000b, 13, 0, 25 },
{ "CRK", 0000000000000101100010000010111b, 18, 0, 20 },
{ "CRSE", 0000000000000001000100111000001 0b, 23, 0, 25 },
{ "CRST", 0000000000000001000100111011011b, 22, 0, 27 },
{ "CSWY", 0000000000000000010010011 10111b, 20, 0, 26 },
{ "CT", 0000000000000000000011110110 11b, 10, 0, 14 },
{ "CTR", 000000000000000000000001 0001110b, 10, 0, 21 },
{ "CTRS", 00000000000000011011010011 01010b, 18, 0, 27 },
{ "CTS", 00000000000000000000001 0111010100b, 12, 0, 20 },
{ "CURV", 0000000000001000100100010101101b, 19, 0, 28 },
{ "CVS", 00000000000001000100100011 11000b, 18, 0, 20 },
{ "CYN", 0000000000000000011011010011 00b, 15, 0, 19 },
{ "D", 00000000000000000000000001 01000b, 6, 0, 0 },
{ "DEPT", 0000000000000000000010 1100001000b, 12, 0, 28 },
{ "DR", 00000000000000000000000010011100b, 8, 0, 13 },
{ "DRS", 000000000000000010110001 00000100b, 16, 0, 19 },
{ "DV", 000000000000000000010110001 00001b, 13, 0, 14 },
{ "E", 00000000000000000000000000101010b, 6, 0, 0 },
{ "EA", 0000000000000000000000001 11011011b, 9, 0, 12 },
{ "EAST", 000000000000000000000010 1000 1000 0b, 10, 0, 26 },
{ "ED", 00000000000000000000000 0101100000b, 9, 0, 12 },
{ "EE", 0000000000000000000000001 11000110b, 9, 0, 12 },
{ "EN", 00000000000000000000000000011101b, 7, 0, 12 },
{ "ER", 00000000000000000000000001 110100b, 7, 0, 13 },
{ "ES", 00000000000000000000000010111000b, 8, 0, 12 },
{ "EST", 00000000000000000000000000101101b, 10, 0, 20 },
{ "ESTS", 000000000000000000000010001 01100b, 16, 0, 26 },
{ "EXPY", 00000000000000100010010001010111b, 18, 0, 29 },
{ "EXT", 0000000000000000000 01 1110110100011b, 14, 0, 22 },
{ "EXTS", 0000000000000010001001 11000000 01b, 24, 0, 28 },
{ "EY", 00000000000000000000000100000101b, 9, 0, 13 },
{ "F", 00000000000000000000000000011010b, 7, 0, 0 },
{ "FALL", 0000000000000000000001 10111101 10b, 14, 0, 23 },
{ "FL", 00000000000000000000000001001101b, 10, 0, 12 },
{ "FLS", 0000000000000001000100100011 1110b, 17, 0, 18 },
{ "FLTS", 0000000000110110100110100101 0000b, 24, 0, 26 },
{ "FRNT", 00000000001111011010000100100001b, 22, 0, 28 },
{ "FRST", 00000000000011011010011010010101b, 22, 0, 28 },
{ "FRY", 0000000000000000010110101011101b, 16, 0, 21 },
{ "FT", 00000000000000000000000110111100b, 11, 0, 15 },
{ "FWY", 00000000000000111011010000101 0b, 17, 0, 21 },
{ "G", 00000000000000000000000001111010b, 7, 0, 0 },
{ "GDNS", 0000000000011110110100001 001 0010b, 21, 0, 25 },
{ "GRN", 0000000000000111011010000 1001 01b, 19, 0, 20 },
{ "GRNS", 0000000001101101001101001 0110100b, 25, 0, 26 },
{ "GRVS", 0000000000001000100111 000000010b, 26, 0, 28 },
{ "GTWY", 00000000000011011010011010010000b, 22, 0, 29 },
{ "H", 00000000000000000000000001111101b, 7, 0, 0 },
{ "HBR", 0000000000000000000001 0001 01111b, 16, 0, 21 },
{ "HIGH", 0000000000000000000010110110001b, 11, 0, 27 },

Fig. 4D

{ "HILL", 0000000000000000000010011011110b, 11, 0, 23 },
{ "HLS", 0000000000000000000010001001100b, 17, 0, 18 },
{ "HNGR", 00000000000011011010011010001001b, 21, 0, 27 },
{ "HOLW", 0000000000000000010001001110001b, 20, 0, 25 },
{ "HOME", 000000000000000000111011001010b, 12, 0, 25 },
{ "HTS", 00000000000000000010111100100110b, 13, 0, 21 },
{ "HWY", 00000000000000000000001000001b, 10, 0, 21 },
{ "I", 0000000000000000000000000001111b, 6, 0, 0 },
{ "IA", 00000000000000000000000111100000b, 9, 0, 12 },
{ "IN", 00000000000000000000000000001110b, 7, 0, 12 },
{ "INC", 00000000000000000000000000010010b, 8, 0, 18 },
{ "IND", 00000000000000000000001010010100b, 10, 0, 18 },
{ "ING", 00000000000000000000000000001010b, 8, 0, 19 },
{ "INLT", 000000000011011010011010010111011b, 24, 0, 25 },
{ "IO", 000000000000000000000010000011101b, 11, 0, 12 },
{ "ION", 0000000000000000000000101001001b, 9, 0, 18 },
{ "IR", 000000000000000000000000100000001b, 9, 0, 13 },
{ "IS", 00000000000000000000000000100001b, 8, 0, 12 },
{ "ISLE", 0000000000000000000110111101111b, 15, 0, 23 },
{ "ISS", 00000000000000000000001101101000b, 12, 0, 18 },
{ "IT", 000000000000000000000000111011010b, 9, 0, 14 },
{ "IVE", 00000000000000000000000100111101b, 9, 0, 20 },
{ "J", 00000000000000000000000000101110b, 8, 0, 0 },
{ "JCT", 0000000000000000011011110111000b, 18, 0, 22 },
{ "JCTS", 0000000000011011010011010010110b, 23, 0, 28 },
{ "K", 000000000000000000000000000010010b, 7, 0, 0 },
{ "KY", 0000000000000000000000000010011b, 12, 0, 14 },
{ "KYS", 0000000000000100010010010101100b, 19, 0, 20 },
{ "L", 00000000000000000000000000010010b, 5, 0, 0 },
{ "LABE", 00000000000000000000101100111001b, 11, 0, 24 },
{ "LAKE", 00000000000000000000000111111101b, 11, 0, 24 },
{ "LAND", 00000000000000000000000001111100b, 10, 0, 23 },
{ "LANE", 00000000000000000000010011101111b, 11, 0, 23 },
{ "LBBY", 0000000000000100100111000000010b, 24, 0, 26 },
{ "LKS", 000000000000010001001000011100b, 17, 0, 18 },
{ "LNDG", 000000000111101101000010010010b, 22, 0, 24 },
{ "LOOP", 00000000000000000010110001000000b, 14, 0, 25 },
{ "LOT", 00000000000000000000011011111010b, 13, 0, 19 },
{ "LOWR", 00000000000000001011010101111000b, 17, 0, 25 },
{ "M", 00000000000000000000000000111001b, 6, 0, 0 },
{ "MALL", 00000000000000000000000110111011b, 11, 0, 22 },
{ "MDWS", 0000000000000000100010011101101b, 22, 0, 25 },
{ "MEWS", 00000000000111101101000100100011b, 21, 0, 25 },
{ "MRS", 00000000000000000000010011000000b, 13, 0, 19 },
{ "MS", 000000000000000000000000001110b, 10, 0, 12 },
{ "MT", 00000000000000000000011011110100b, 13, 0, 14 },
{ "MTN", 00000000000000000001101111011101b, 16, 0, 20 },
{ "MTNS", 00000000011011010011010010110101b, 25, 0, 26 },
{ "MTWY", 0000000000001000100111000000011b, 26, 0, 28 },
{ "N", 00000000000000000000000000000101b, 6, 0, 0 },
{ "NCK", 00000000000000010001001000111101b, 17, 0, 19 },
{ "NE", 00000000000000000000000011111000b, 8, 0, 12 },

Fig. 4E

{ "NOR", 00000000000000000000001111000010b, 10, 0, 19 },
{ "NUE", 00000000000000000000001001110110b, 10, 0, 19 },
{ "NW", 00000000000000000000010001000111b, 11, 0, 13 },
{ "O", 00000000000000000000000000100011b, 6, 0, 0 },
{ "OA", 00000000000000000000000000010000b, 8, 0, 12 },
{ "OF", 00000000000000000000001011011010b, 10, 0, 13 },
{ "OFC", 00000000000000000000010001001111b, 17, 0, 19 },
{ "OO", 00000000000000000000000000011010b, 8, 0, 12 },
{ "OPAS", 00000000000000000100010011100001b, 21, 0, 26 },
{ "OR", 00000000000000000000000000000111b, 7, 0, 13 },
{ "ORCH", 00000000000000000000110110100111b, 14, 0, 26 },
{ "OU", 00000000000000000000000100110010b, 9, 0, 13 },
{ "OUR", 00000000000000000000010110000101b, 11, 0, 20 },
{ "OUT", 00000000000000000000010011011111b, 11, 0, 21 },
{ "OVAL", 00000000000000111101101000001000b, 17, 0, 25 },
{ "P", 00000000000000000000000011100010b, 8, 0, 0 },
{ "PARC", 00000000000000000000001011111100b, 12, 0, 27 },
{ "PARK", 00000000000000000000000011001001b, 10, 0, 28 },
{ "PASS", 00000000000000000000101101010101b, 14, 0, 26 },
{ "PATH", 00000000000000001011000100000110b, 16, 0, 29 },
{ "PH", 00000000000000000000000011011100b, 10, 0, 15 },
{ "PIER", 00000000000000000000101101010100b, 14, 0, 27 },
{ "PIKE", 00000000000000000000000000010010b, 12, 0, 27 },
{ "PKWY", 00000000000000000000000000100011b, 12, 0, 29 },
{ "PL", 00000000000000000000001111000110b, 10, 0, 13 },
{ "PLA", 00000000000000000000000011001000b, 10, 0, 19 },
{ "PLZ", 00000000000000011110110100001011b, 17, 0, 22 },
{ "PNE", 00000000000000000110111101111001b, 17, 0, 20 },
{ "PO", 00000000000000000000000101110110b, 9, 0, 14 },
{ "PP", 00000000000000000000001010010001b, 10, 0, 16 },
{ "PR", 00000000000000000000000001100101b, 9, 0, 15 },
{ "PRT", 00000000000000100010010001111111b, 18, 0, 23 },
{ "PRTS", 00000000000000000100100111010111b, 21, 0, 29 },
{ "PT", 00000000000000000000000100110001b, 12, 0, 16 },
{ "PTS", 00000000000000000100010010000110b, 15, 0, 22 },
{ "Q", 00000000000000000000000000110011b, 10, 0, 0 },
{ "R", 00000000000000000000000000000100b, 7, 0, 0 },
{ "RADL", 00000000000000000000000010001000b, 14, 0, 24 },
{ "RAMP", 00000000000000010001001000111110b, 18, 0, 27 },
{ "RD", 00000000000000000000000001110111b, 8, 0, 13 },
{ "RDG", 00000000000000100010010001111001b, 18, 0, 20 },
{ "RDS", 00000000000000000000101110010011b, 13, 0, 19 },
{ "REAR", 00000000000000000000110110100110b, 16, 0, 26 },
{ "REET", 00000000000000000000001111000010b, 9, 0, 27 },
{ "RIV", 00000000000000000000000001001100b, 9, 0, 21 },
{ "RM", 00000000000000000000000100100111b, 10, 0, 13 },
{ "RNCH", 00000000000011011010011010010001b, 22, 0, 26 },
{ "ROW", 00000000000000000000001010010101b, 12, 0, 20 },
{ "RPDS", 00000000110110100110100101000101b, 26, 0, 27 },
{ "RST", 00000000000000000000010100101000b, 12, 0, 21 },
{ "RT", 00000000000000000000000010100111b, 8, 0, 15 },
{ "RTE", 00000000000000000000001011111101b, 12, 0, 21 },

Fig. 4F

{ "RUE", 0000000000000000111101101000011b, 15, 0, 20 },
{ "RUN", 0000000000000000000011011110101b, 13, 0, 20 },
{ "S", 00000000000000000000000000101111b, 6, 0, 0 },
{ "SALE", 0000000000000000000010101101101b, 11, 0, 23 },
{ "SCH", 0000000000000000000000010100011001b, 10, 0, 19 },
{ "SE", 00000000000000000000000010000001b, 8, 0, 12 },
{ "SERV", 00000000000000000000000001101101b, 10, 0, 27 },
{ "SH", 000000000000000000000000101100111b, 9, 0, 13 },
{ "SHL", 0000000000000000000001001111101001b, 13, 0, 18 },
{ "SHR", 00000000000000001000100100010100b, 16, 0, 20 },
{ "SHRS", 00000000000110110100110100101001b, 23, 0, 26 },
{ "SIDE", 000000000000000000000000100000111000b, 12, 0, 24 },
{ "SKWY", 00000000110110100110100101000100b, 26, 0, 27 },
{ "SLIP", 0000000000000010110001000010110b, 18, 0, 25 },
{ "SMT", 000000000000000110110100110100001b, 19, 0, 20 },
{ "SOUT", 0000000000000000000001010110111b, 10, 0, 27 },
{ "SP", 0000000000000000000000000000100111b, 9, 0, 14 },
{ "SPC", 000000000000000000000100010001101b, 17, 0, 20 },
{ "SPGS", 000000000000000011011010011010000b, 19, 0, 27 },
{ "SPUR", 00000000000000000000001000101101b, 16, 0, 28 },
{ "SQ", 000000000000000000000000110111100b, 12, 0, 16 },
{ "ST", 00000000000000000000000011111001b, 8, 0, 14 },
{ "STA", 000000000000000000000001010010110b, 10, 0, 20 },
{ "STE", 0000000000000000000000000100111111b, 9, 0, 20 },
{ "STOP", 0000000000000000000101101010110b, 14, 0, 28 },
{ "STOR", 00000000000000000000010100110110b, 11, 0, 27 },
{ "STR", 0000000000000000000000000000110001b, 8, 0, 21 },
{ "STRA", 000000000000000011110110100000b, 14, 0, 27 },
{ "STRM", 000000000000000010001001110100b, 20, 0, 27 },
{ "STS", 000000000000000010110101011111b, 15, 0, 20 },
{ "SUIT", 00000000000000000000010011011110b, 10, 0, 27 },
{ "SW", 0000000000000000000000010001001100b, 11, 0, 13 },
{ "T", 000000000000000000000000000011110b, 8, 0, 0 },
{ "TER", 00000000000000000000000000011011b, 8, 0, 21 },
{ "TH", 0000000000000000000000000001100b, 7, 0, 15 },
{ "THE", 00000000000000000000001111000011b, 10, 0, 21 },
{ "TO", 000000000000000000000000010011010b, 8, 0, 14 },
{ "TPKE", 0000000000000010110001000001010b, 17, 0, 29 },
{ "TRAK", 000000000000000001101111011100001b, 18, 0, 28 },
{ "TRCE", 0000000000000000100010011101100b, 21, 0, 27 },
{ "TRFY", 00000000000010001001110000000000b, 25, 0, 29 },
{ "TRL", 000000000000001011000100000111b, 16, 0, 20 },
{ "TRLR", 000000000000001101101001101001b, 19, 0, 27 },
{ "TRWY", 000000000000000100010011101010b, 21, 0, 29 },
{ "TT", 00000000000000000000000001011011b, 9, 0, 16 },
{ "TUNL", 0000000000000001000100111000000011b, 24, 0, 26 },
{ "U", 00000000000000000000000001110101b, 7, 0, 0 },
{ "UI", 0000000000000000000000000000110000b, 10, 0, 13 },
{ "UN", 00000000000000000000000100010100b, 9, 0, 13 },
{ "UNIT", 0000000000000000000000010011001101b, 11, 0, 27 },
{ "UNS", 000000000000000000000110110100010b, 13, 0, 19 },
{ "UPAS", 00000000001111011010000100100000b, 22, 0, 27 },

Fig. 4G

{ "UPPR", 0000000000011011010011010010111b, 22, 0, 30 },
{ "UPS", 000000000000000010001001000010b, 14, 0, 21 },
{ "V", 000000000000000000000010011000b, 8, 0, 0 },
{ "VIA", 00000000000000000000001001100001b, 13, 0, 20 },
{ "VLG", 000000000000010001001000011011b, 18, 0, 20 },
{ "VLY", 000000000000000110110100110 1011b, 18, 0, 20 },
{ "W", 0000000000000000000000001110111b, 7, 0, 0 },
{ "WALK", 00000000000000000100010010001 00b, 14, 0, 25 },
{ "WALL", 00000000000000000011110110100010b, 14, 0, 23 },
{ "WAY", 000000000000000000000001000000b, 9, 0, 20 },
{ "WAYS", 0000000000000001000100100001111b, 16, 0, 26 },
{ "WEST", 00000000000000000000000001111b, 9, 0, 27 },
{ "X", 00000000000000000000010111010b, 8, 0, 0 },
{ "XING", 000000000000000100100100010 11b, 15, 0, 27 },
{ "Y", 000000000000000000000001011010b, 7, 0, 0 },
{ "Z", 000000000000000000000000001110b, 9, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },
{ "0x0", 0000000000000000000000000000000b, 0, 0, 0 },

Fig. 4H

| FIELD NAME | MAX SIZE SYMBOLS & TYPE |
|---|---|
| Message Header 1)>Rs | 6 (includes two symbols for Codeset A Escape characters) |
| Format 01 Header 01Gs 96 | 5 |
| Ship to Postal Code | Mode 2-9N Mode 3-6AN |
| Field Separator Gs | 1 |
| Ship to ISO Country Code | 3N |
| Field Separator Gs | 1 |
| Class of Service | 3N |
| Field Separator Gs | 1 |
| Tracking Number | 10AN Track # |
| Field Separator Gs | 1 |
| Origin Carrier SCAC UPSN | 4 |
| Field Separator Gs | 1 |
| Shipper ID | 6AN |
| Format Trailer Rs | 1 |
| Format Header Indicator (07) (free form text)[5] | 2 |
| UPS Free Form Text | AN45 |
| Format Trailer (Rs) | 1 |
| Message Trailer Eot | 2 (includes one symbol for Codeset A Escape character) |
| Total Symbols in Secondary Portion of MaxiCode | 84 |

FIG. 5

Layer 2 - Pickup Work Assignment

Layer 3 - Other Delivery Work Assignment

Layer 4 - Actual Driver Trace and Performance

COMPRESSION UTILITY FOR USE WITH SMART LABEL PRINTING AND PRE-LOADING

RELATED APPLICATIONS

This application claims the benefit and priority of now abandoned Provisional Application having Ser. No. 60/254,661, filed Dec. 11, 2000, which is incorporated herein by reference.

FIELD OF THE INVENTION

Systems, methods, processes and computer program products of the present invention to capture, store and print package level detail in a machine-readable format to allow automation of the pre-load sortation process of a parcel delivery service.

BACKGROUND OF THE INVENTION

The need to store, manipulate and transmit package level detail is becoming increasingly important in the package transportation industry, especially as new sortation technologies and processes are developed. The volume of packages grows exponentially each year, along with customer requirements for greater package tracking and faster delivery. These factors present an ongoing challenge to shippers throughout the country and shippers work continuously to automate the sortation process to meet this challenge. Much of the success of this effort depends on the shipper's ability to acquire enough detail to effectively route packages through the sortation system and ultimately, onto a shelf in a package car.

A critical stage in a package delivery system is the pre-load sortation of packages that occur at a carrier destination facility. Pre-load sortation is a process in which carrier pre-loaders load packages onto delivery vehicles for delivery to the ultimate destination. A carrier destination facility generally has a plurality of package cars that are pre-loaded simultaneously and each package car has a variety of potential load positions. Pre-loaders have the responsibility of ensuring that the packages are loaded on the correct shelf of the correct package car and, to date, this process has been manual. Pre-loaders physically examine the destination address on the package label and determine from memory or from written pre-load charts, which package truck delivers to that address and which shelf on the truck holds the packages for that address. This is a complex task and requires that pre-loaders receive extensive training on how to properly load packages. Not surprisingly, the manual intensiveness of this pre-load process causes errors in pre-loads and increased training costs. In today's environment with high turnover rates, the increased training time negatively impacts the ability to create and sustain a workforce capable of providing quality loads.

Dispatch plans are integrally related to the pre-load process. In general, a dispatch plan is the schedule or route through which a carrier assigns work to carrier service providers (such as package car drivers) to efficiently coordinate and schedule the pickup and delivery of packages. Dispatch plans are well known in the carrier industry and are used daily by commercial carriers to manage driver delivery routes. Dispatch plans are also integrally tied to the pre-load process as a pre-load depends in large part on the dispatch plan assigned to the delivery vehicles that are loaded. Because pre-load handling instructions are based upon a dispatch plan, significant changes to a dispatch plan often resulted in changes to the pre-load process. Because the pre-load processes known in the art are knowledge-based, a carrier is limited on how often it can change a dispatch plan without disrupting the pre-load process. This inflexibility in dispatch planning results in inefficient delivery routes and untimely deliveries.

A need therefore exists in the industry for a system that automatically generates pre-load instructions for packages in a pre-load. The presentation needs to be sufficiently simple to understand that an inexperienced pre-loader can correctly perform a pre-load.

Another need that presently exists is for a system that captures and electronically provides package destination address information at the carrier destination facility. A pre-load system configured to provide handling and pre-load instructions for a package necessarily requires the package destination address information to generate the handling instructions.

Still another need exists for a system that automatically updates a pre-load scheme based upon a change to a dispatch plan.

Thus, an unsatisfied need exists for improved systems for handling package pre-loading operations that overcomes deficiencies in the prior art, some of which are discussed above.

SUMMARY OF THE INVENTION

The present invention provides systems and methods for electronically-capturing a destination address of a package and for using the destination address to automate a package pre-load operation. An embodiment of the invention includes a compression system for compressing the destination address as a compressed MaxiCode symbol, a smart shipping label system for generating a shipping label with a compressed MaxiCode and a pre-load assist system for generating package handling instructions from the electronically-captured destination address.

In accordance with an embodiment of the present invention, a system for generating a shipping label with a destination address encoded as a machine-readable symbol is disclosed that includes a client application in electronic communication with a shipping label tool and a shipping label generator in communication with the shipping label tool and the client application, the shipping label generator configured to generate the shipping label and pass the shipping label to the client application.

In accordance with another embodiment of the present a package pre-load system is disclosed that includes a pre-load assist server, a pre-load application residing on the pre-load assist server and configured to receive a dispatch plan and generate a pre-load scheme based at least in part on the pre-load scheme, and a pre-load package handling instructions application configured to generate package handling instructions based at least in part on a package destination address and the pre-load scheme.

In accordance with another embodiment of the present invention, a method for compressing geographical location data is disclosed that includes the steps of analyzing a set of data to identify one or more character strings that appear with the greatest frequency in the data, associating a unique pattern to each of the identified one or more character strings and substituting the one or more character strings with the associated unique pattern.

In accordance with another embodiment of the present invention, a method for loading a package on a delivery vehicle is disclosed that includes the steps of capturing electronically a destination address of a package, generating package handling instructions based at least in part on the electronically-captured destination address and loading the package on the delivery vehicle based at least in part on the package handling instructions. In another related embodiment, the steps of scanning a machine-readable symbol on a shipping label to obtain a compressed destination address and decompressing the compressed destination address is disclosed. In another related embodiment, the steps of performing an address validation routine against the electronically-captured destination address and prompting a package pre-loader to review the electronically-captured destination address if the validation routine returns an error is disclosed. In another related embodiment, the steps of identifying a delivery vehicle associated with a destination address, identifying a load position on the delivery vehicle and generating a package assist label that identifies the delivery vehicle and load position is disclosed.

In still another embodiment of the present invention, a method of delivering a package to a destination address associated with the package is disclosed that includes the steps of encoding at least a portion of the destination address as a machine-readable symbol at a first location, affixing the machine-readable symbol to the package, sending the package to a second location, decoding the destination address from the machine-readable symbol, generating package handling instructions based at least in part on the decoded destination address and delivering the package to the decoded destination address. In related embodiments, the steps of generating a package assist label that identifies a delivery vehicle and a load position on the delivery vehicle, placing the package on the delivery vehicle at the identified load position and using the delivery vehicle to deliver the package to the destination address is disclosed.

BRIEF DESCRIPTION OF THE DRAWINGS

Figure 1:
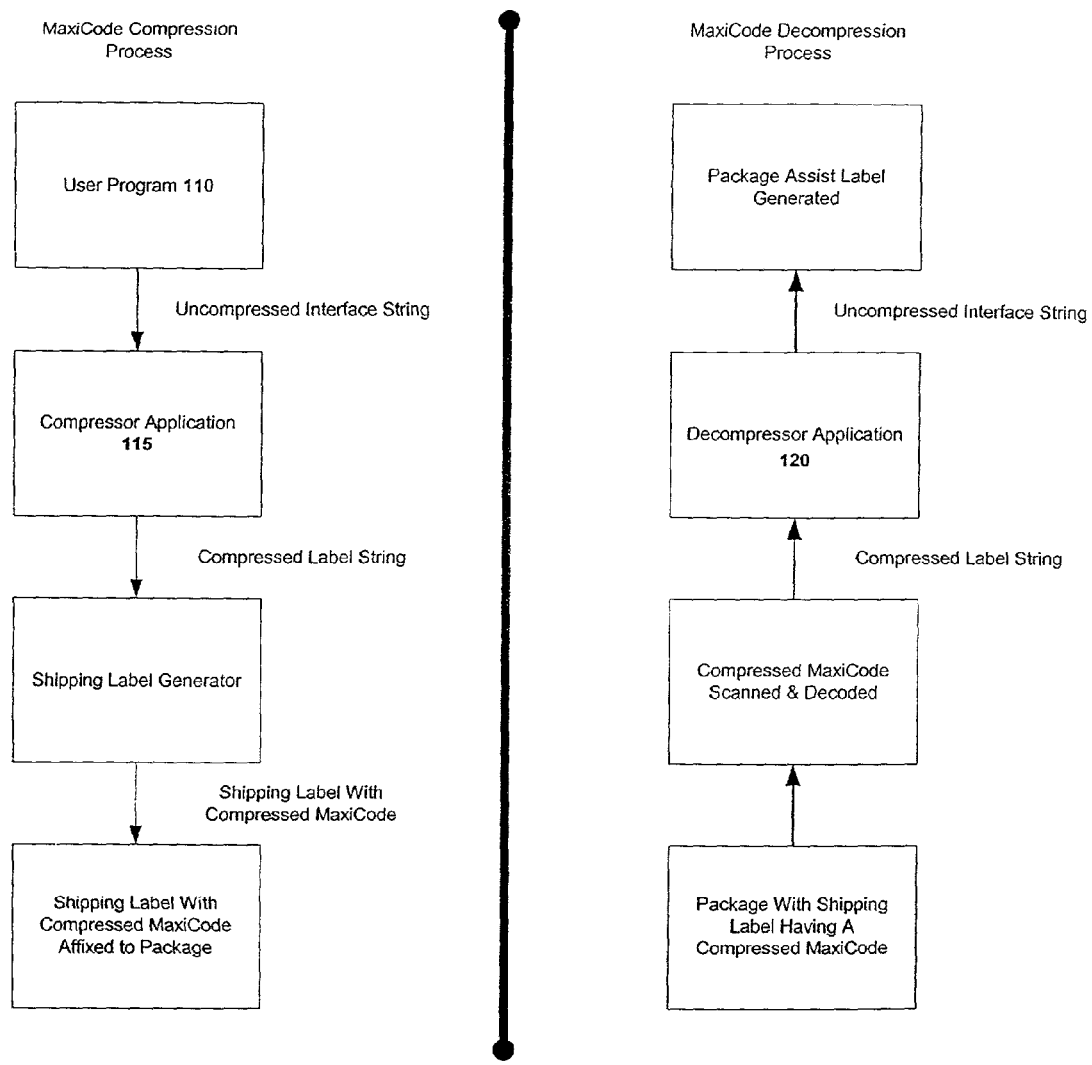

Having thus described the invention in general terms, reference will now be made to the accompanying drawings, which are not necessarily drawn to scale, and wherein:

FIG. 1 is a high-level flowchart that shows a process for MaxiCode compression and decompression.

FIG. 2 is an illustrative data specification for an interface string.

FIG. 3A illustrates a destination address as it appears on a shipping label.

FIG. 3B illustrates a destination address reformatted as an uncompressed interface string.

Figure 4B:
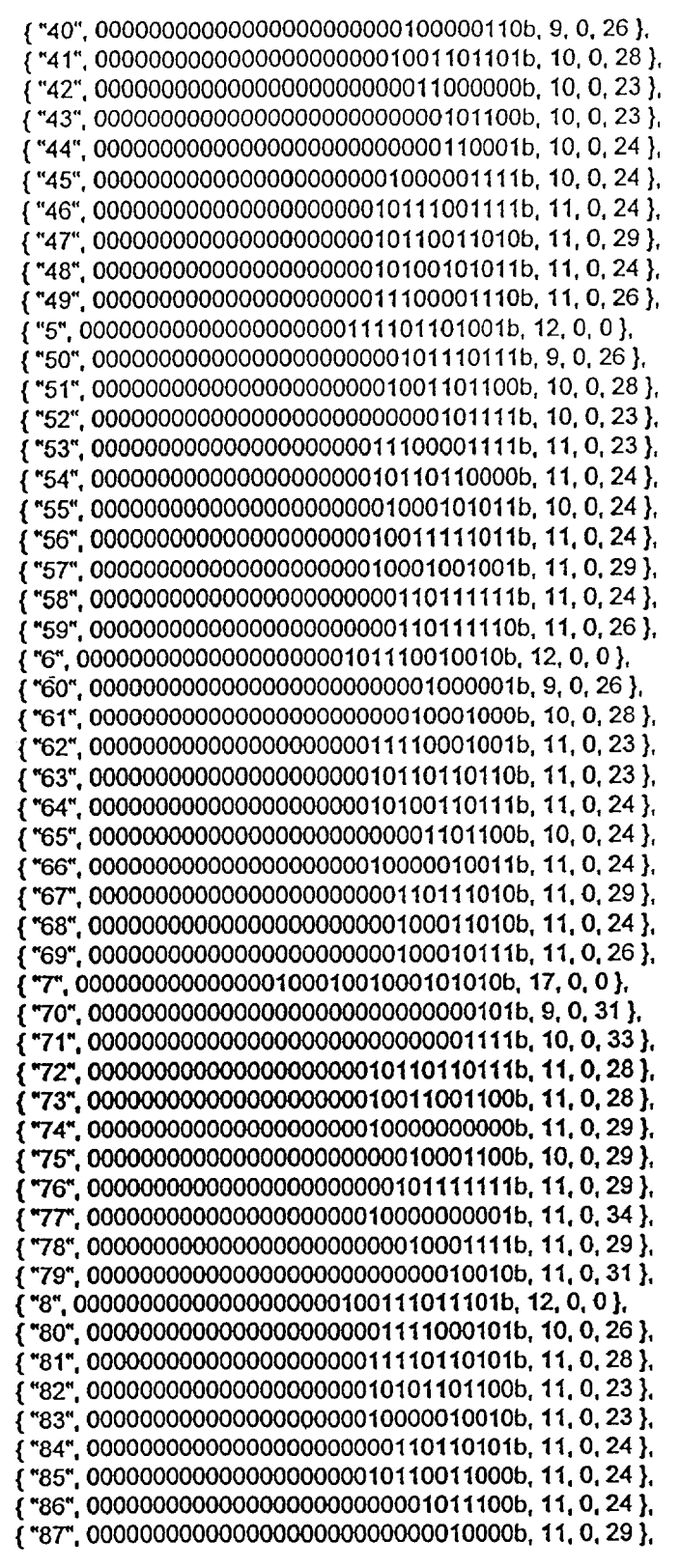

FIGS. 4A–4H is an illustrative compression substitution table.

FIG. 5 is an illustrative data specification for a label string output from a compressor.

Figure 6:
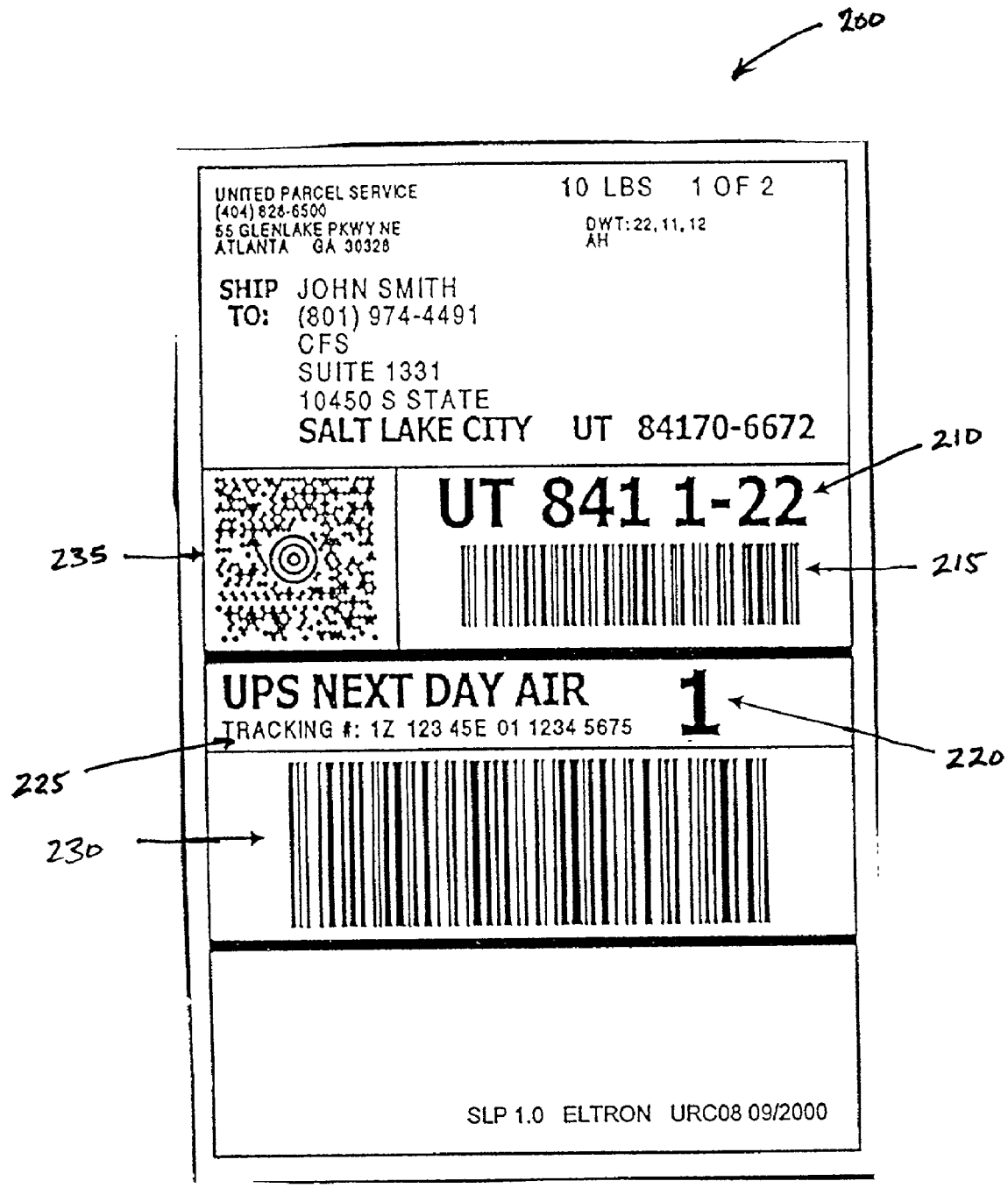

FIG. 6 is an illustrative smart shipping label.

Figure 7:
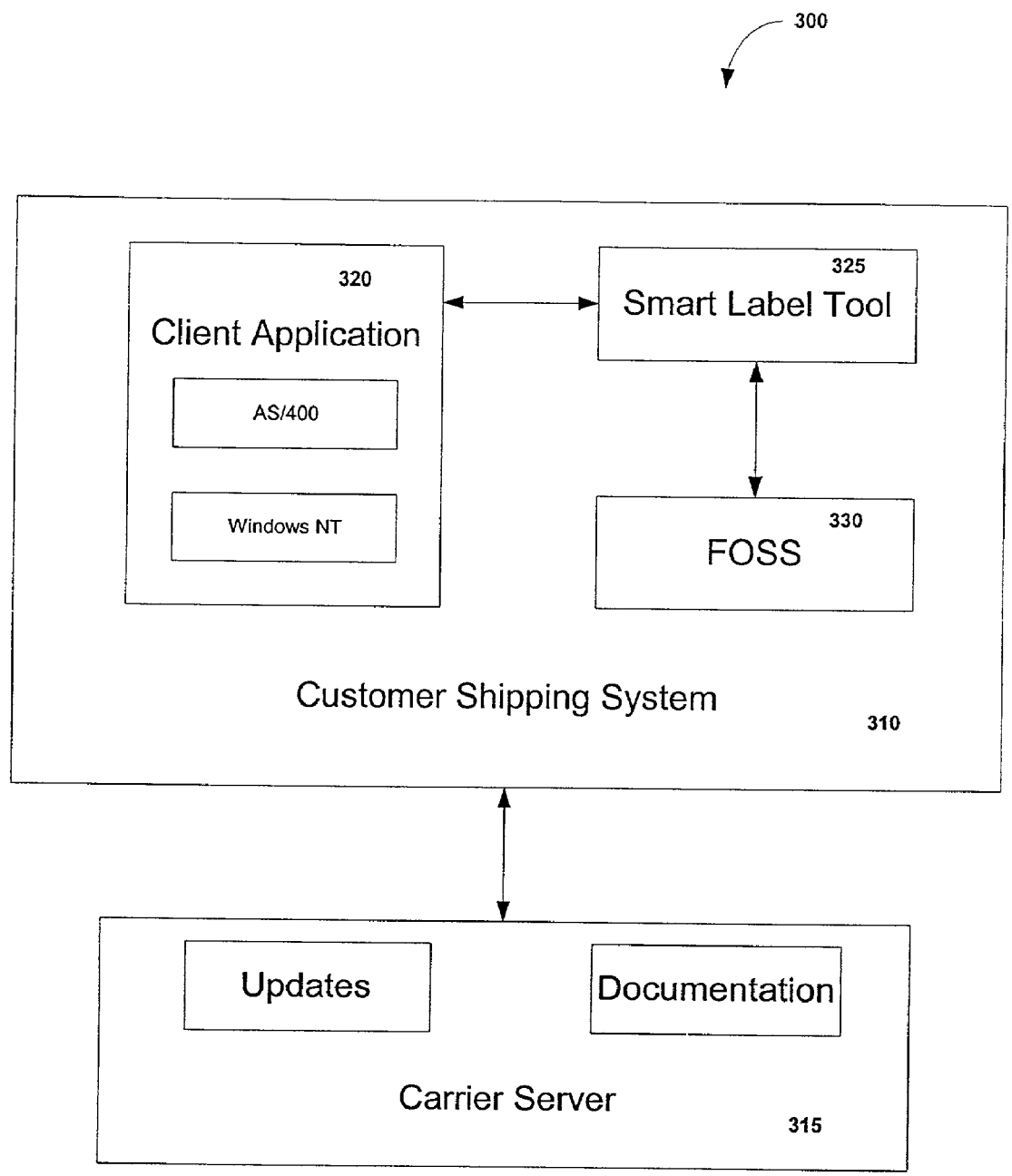

FIG. 7 illustrates the architecture of a system for generating smart shipping labels in accordance with an embodiment of the present invention.

Figure 8:
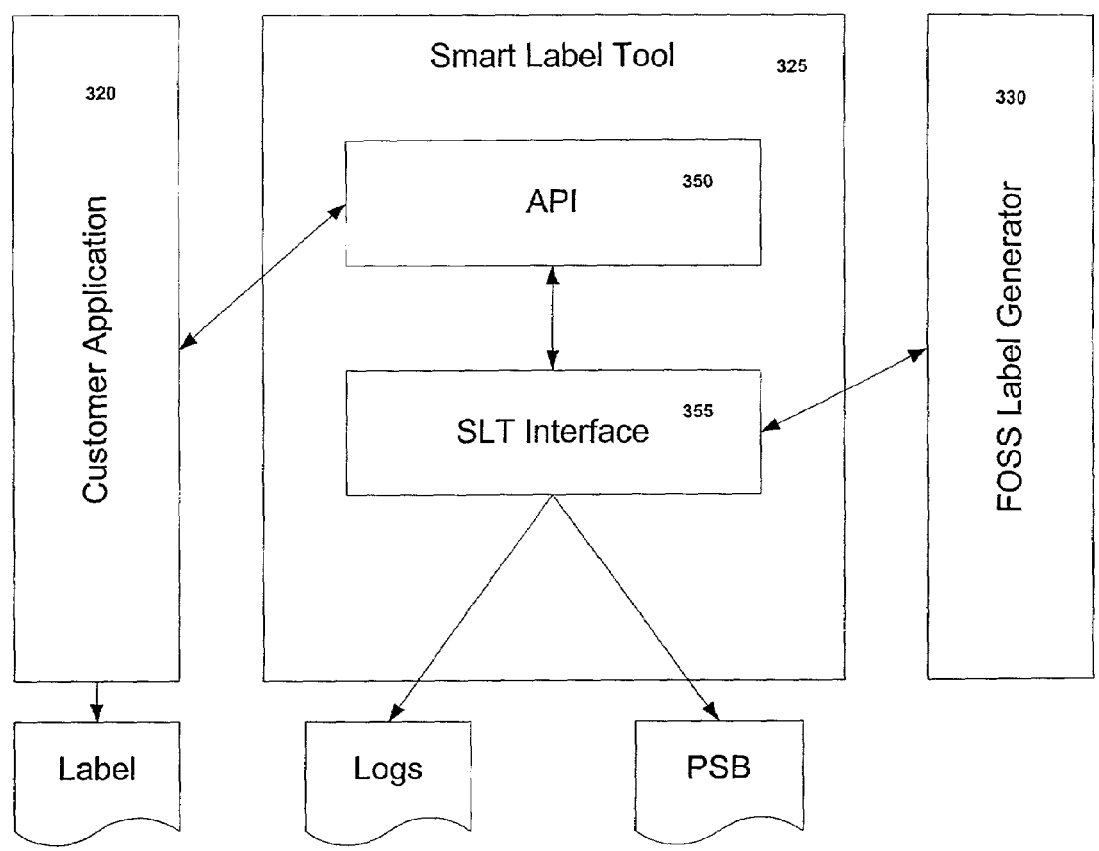

FIG. 8 illustrates the architecture of a smart label tool in accordance with an embodiment of the present invention.

Figure 9:
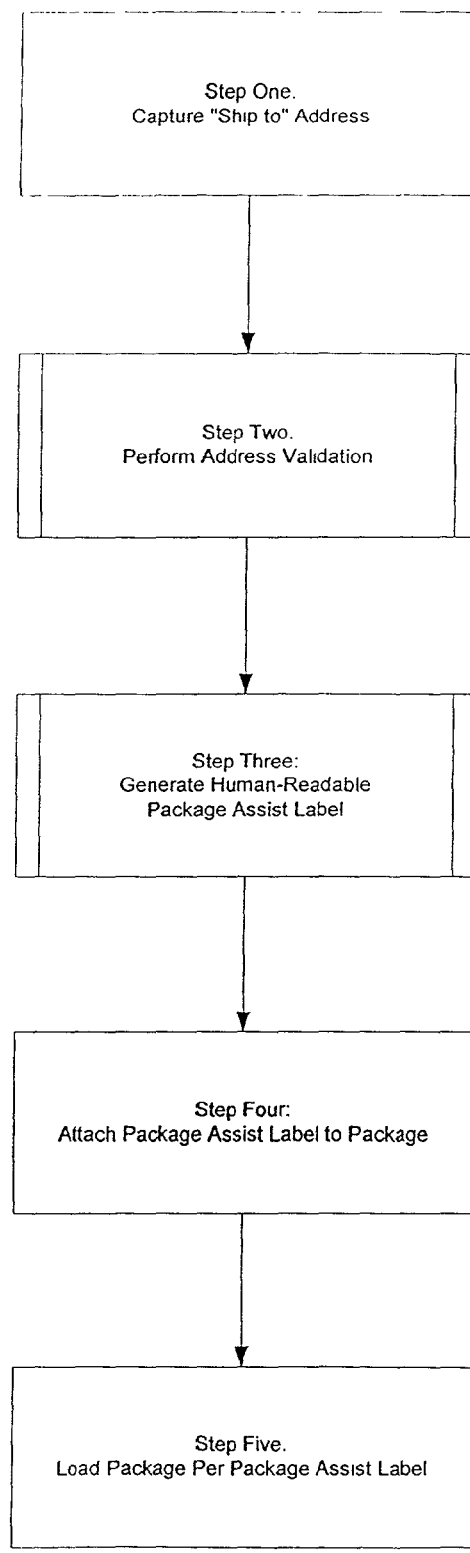

FIG. 9 is a high-level diagram that illustrates the operation of a pre-load assist system in accordance with an embodiment of the present invention.

Figure 10:
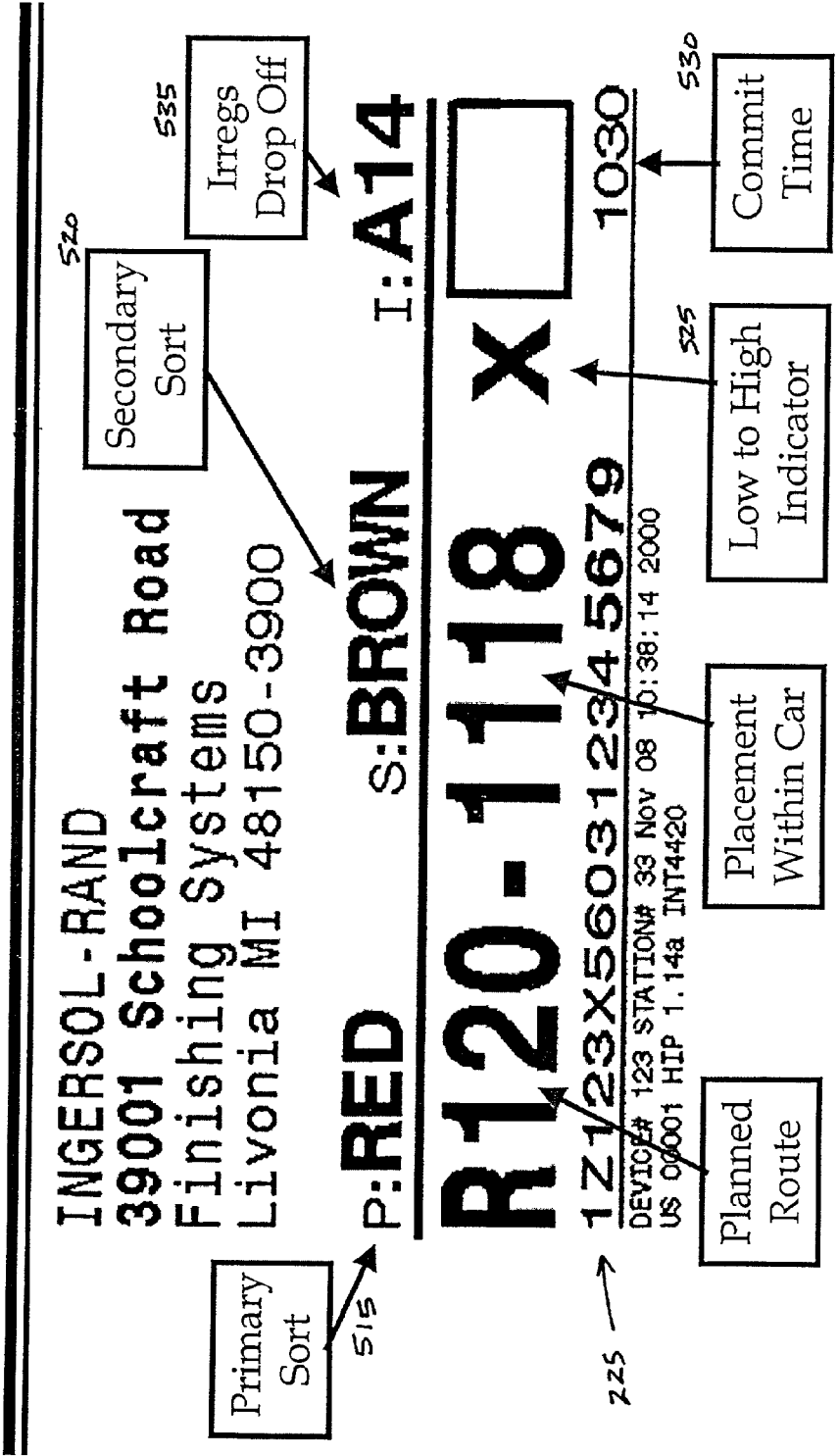

FIG. 10 is an illustrative package assist label.

Figure 11:
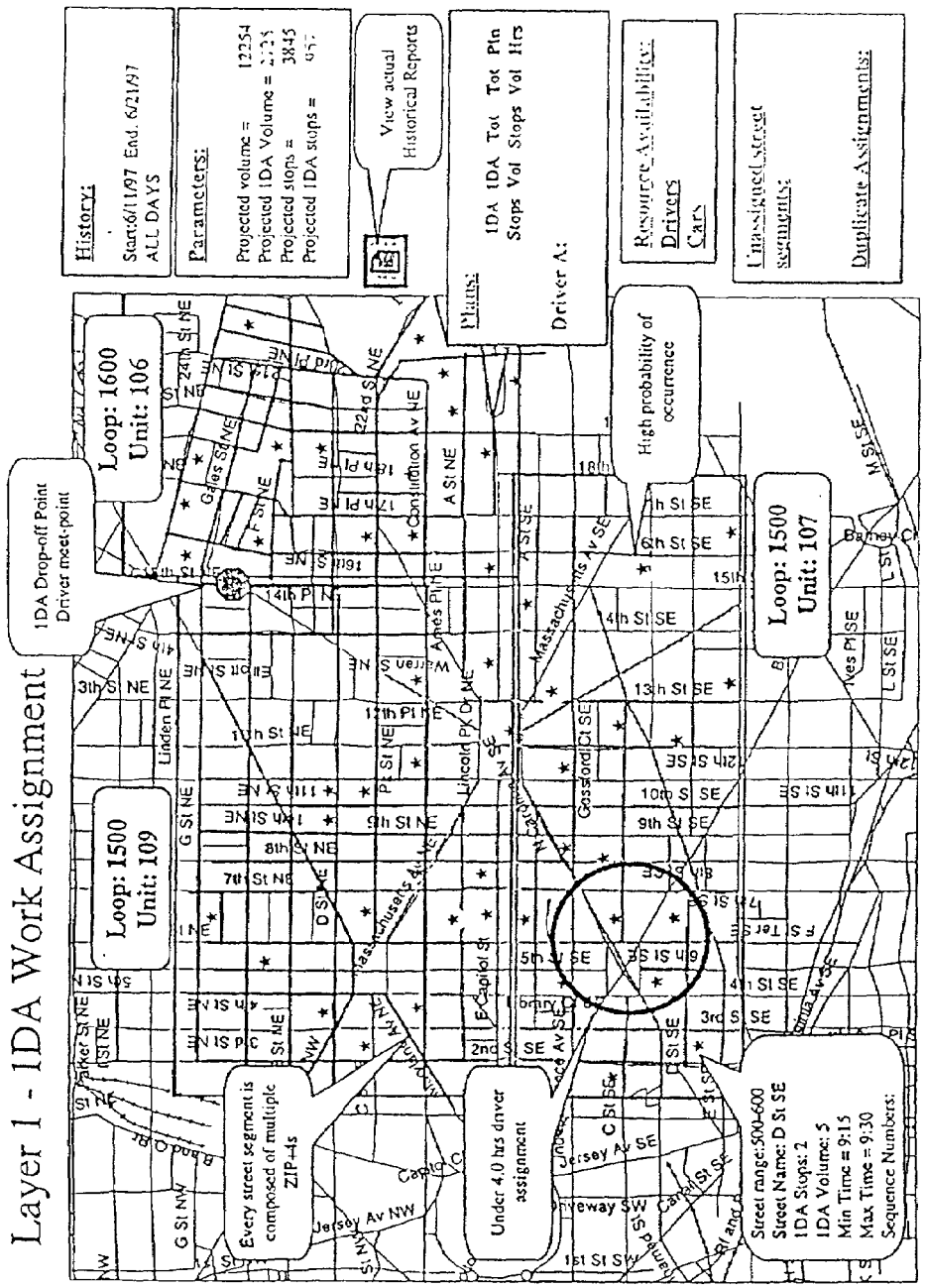

FIG. 11 illustrates a first layer of a map overlay of a dispatch planning system.

Figure 12:
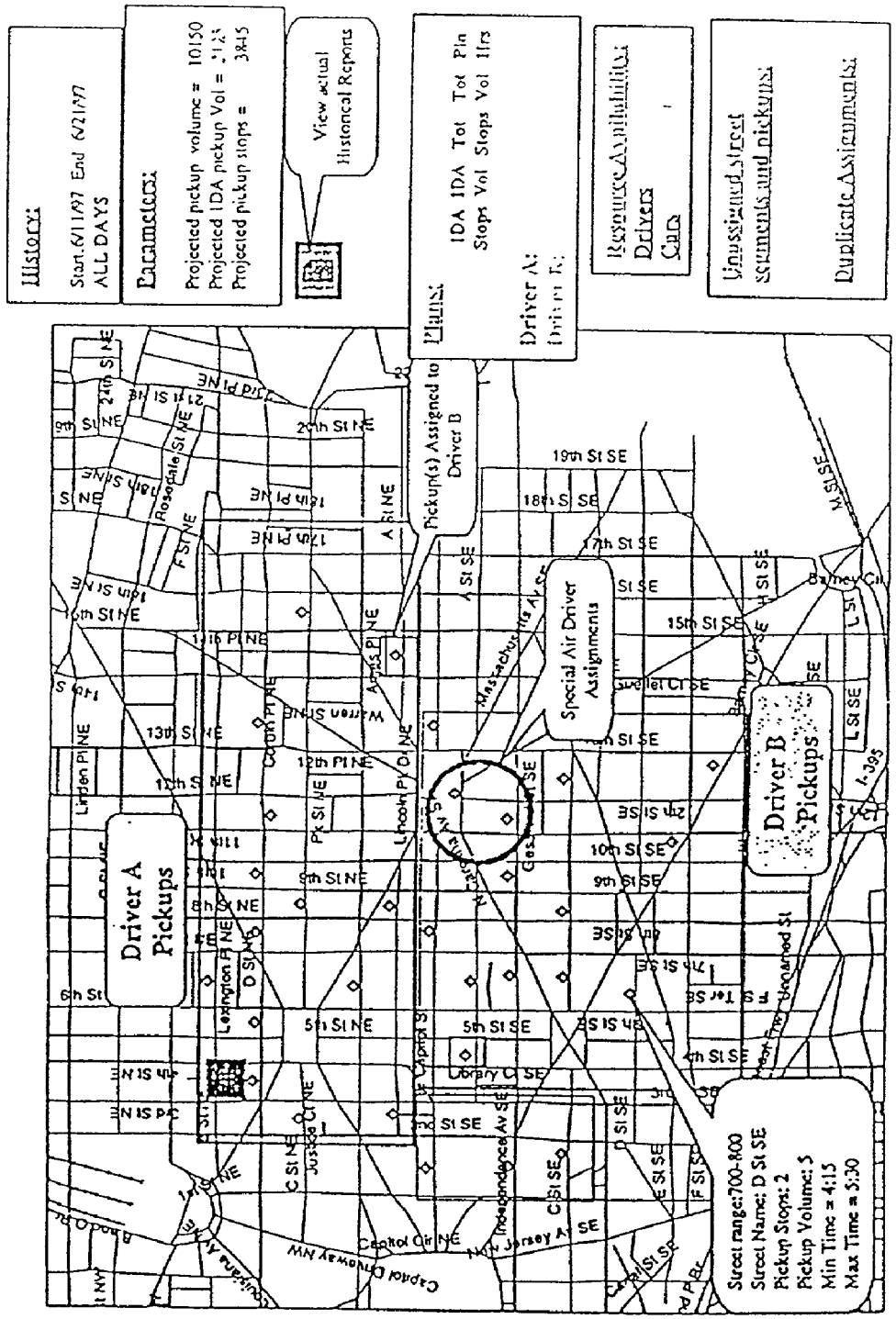

FIG. 12 illustrates a second layer of a map overlay of a dispatch planning system.

Figure 13:
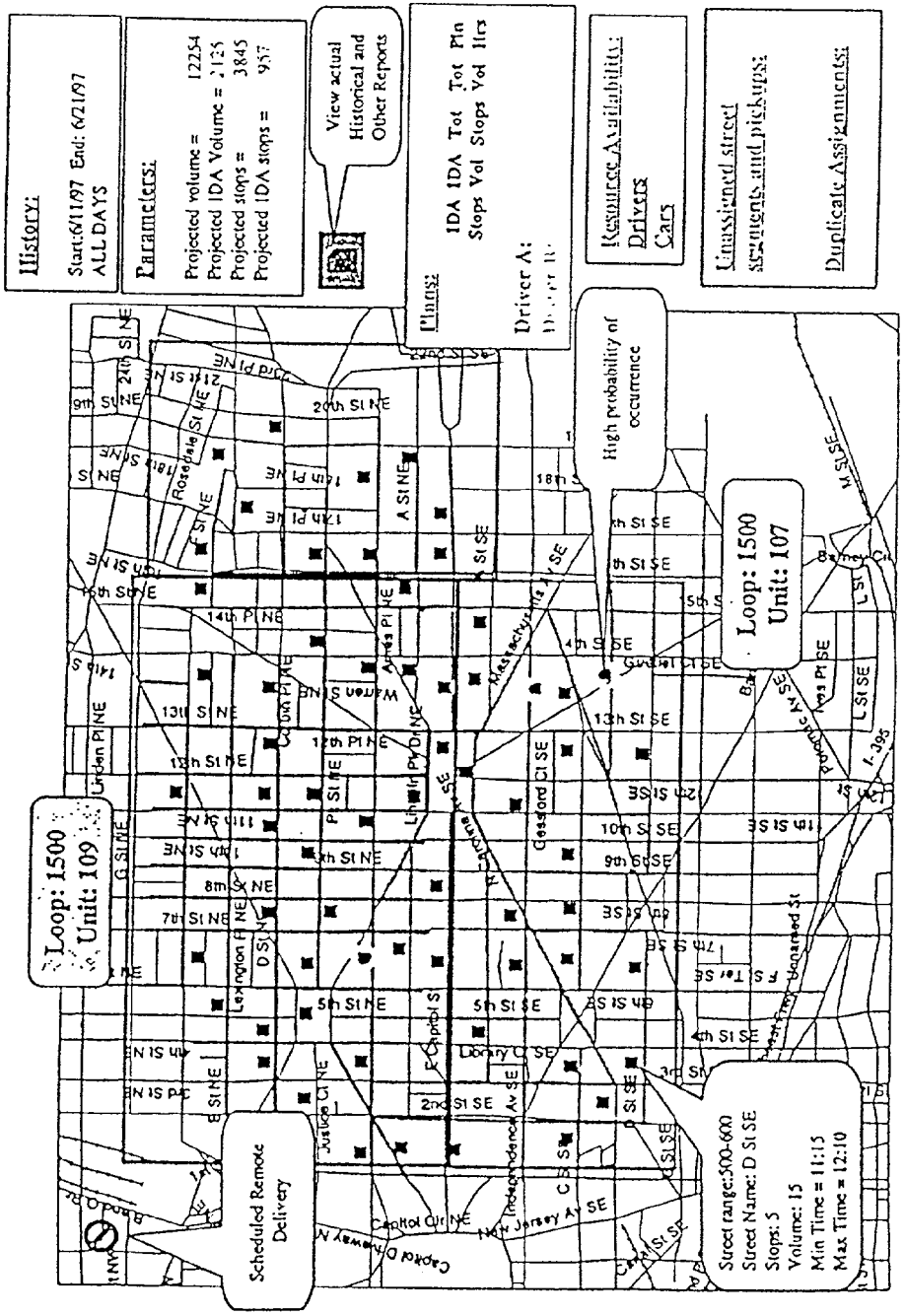

FIG. 13 illustrates a third layer of a map overlay of a dispatch planning system.

Figure 14:
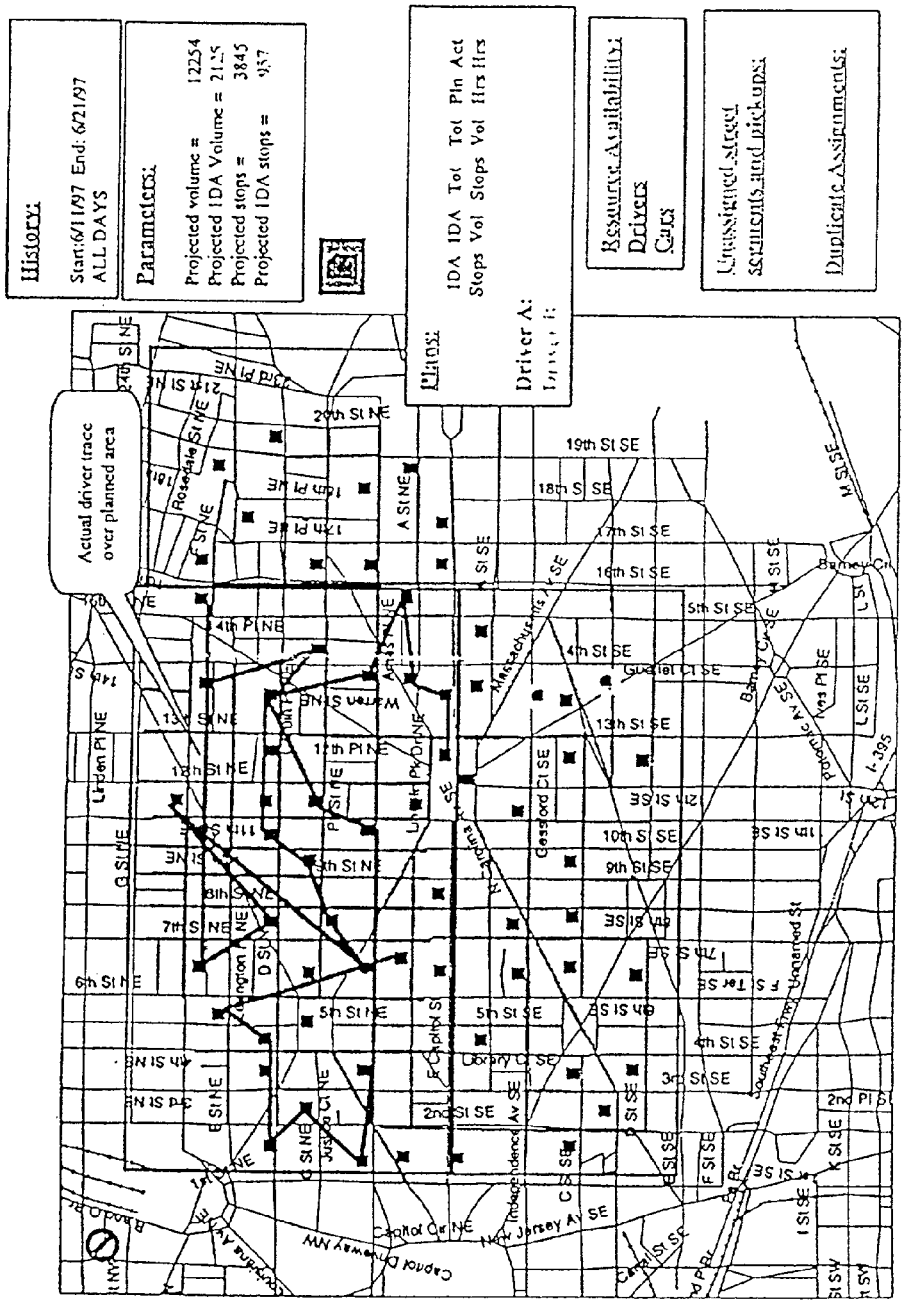

FIG. 14 illustrates a fourth layer of a map overlay of a dispatch planning system.

Figure 15:
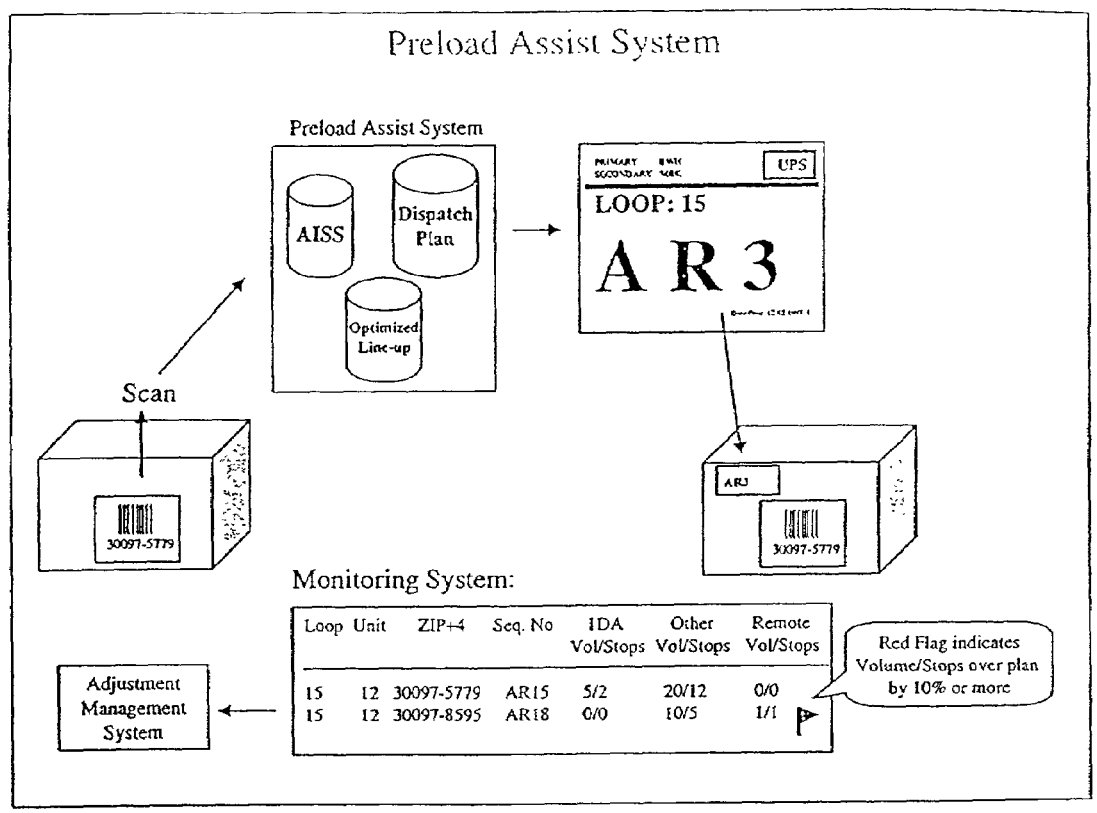

FIG. 15 is a process flow diagram that shows how a routing system interfaces with an address information and sequencing system to generate pre-load sorting and loading instructions.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

A. Compressed MaxiCode

An element of the automatic package sortation and pre-load process described herein is a system and method for MaxiCode compression. A MaxiCode is a two-dimensional symbology that encodes roughly 100 characters of data in an area of one square inch. MaxiCodes are well-known in the art and have been the subject of several patents, among them U.S. Pat. Nos. 5,610,995 to Zheng et al. and U.S. Pat. No. 6,149,059 to Ackley. In 1996, the American National Standards Institute (ANSI) recommended MaxiCode as the most appropriate vehicle for sorting and tracking transport packages and carriers such as the United Parcel Service (UPS) use MaxiCodes on shipping labels to encrypted basic billing and shipping information. To date, however, the storage capacity of the MaxiCode label has restricted encoding to basic top-level shipping information such as city, state and zip.

The following paragraphs describe a compression and decompression process to increase the amount of data that can be encoded in a MaxiCode. As described below, the additional storage capacity of a compressed MaxiCode permits shipping information at the level of street address to be encoded in a shipping label and results in an improved package sortation process.

FIG. 1 is a high-level flowchart that shows the process for MaxiCode compression and decompression in accordance with an embodiment of the present invention. In FIG. 1, a user program 110 captures label information and formats the label information as an ANSI-compliant interface string ("interface string"). In the embodiment described below, ANSI-compliant means that the interface string matches the ANSI format described in the ANSI specification MH10.8.3M-1996; however, one of ordinary skill in the art will readily recognize that the present invention is not limited to this specification. The ANSI specification is inclusive where pertinent as to the content and/or encoding for each field and describes a sentence structure for the data. Elements of the sentence include messages and formats. In one embodiment, a message contains two formats; and messages and formats use headers and trailers to identify where they begin and end, and to identify their type.

The format types that are used in a preferred embodiment are '01' for transportation, '05' for application identifiers; and '07' for free form text data. Thus, ANSI-compliant interface strings (input to the compressor) and ANSI-compliant label strings (output from the compressor) are essentially messages incorporating formats '01'/'05' and '01'/'07' respectively. In one embodiment, formats '01' and '05' carry predominantly printable ASCII data (32 to 127 decimal, excluding '*' (42 decimal)), while format '07' is restricted to the following 55 different symbols: (<CR>, 'A', 'B', 'C', 'D', 'E', 'F', 'G', 'H', 'I', 'J', 'K', 'L', 'M', 'N', 'O', 'P', 'Q', 'R', 'Q', 'R', 'S', 'T', 'U', 'V', 'W', 'X', 'Y', 'Z', <Fs>, <Gs>, ' ', '"', '#', '$', '%', '&', "'", '(', ')', '*', '+', ',', '31 ', '.', '/', '0', '1', '2', '3', '4', '5', '6', '7', '8', '9', ':').

FIG. 2 shows a data specification for an interface string in accordance with one embodiment of the present invention. Data elements are placed in a prioritized sequence so that lower priority data elements are more likely to be impacted in the event that data truncation occurs in the compression or label generation processes that follow. As an example, the data specification shown in FIG. 2 allocates five fields to store shipping destination address information; these fields are "ship to address line 1" through "ship to address line 5." If more information is stored in the destination address fields than can be represented by a MaxiCode, the address is truncated. In a preferred embodiment, no truncation occurs until the '07' format of an ANSI-compliant label string is populated with at least 45 symbols. Because the symbols are post compression, the number of ANSII characters incorporated in the interface string prior to truncation can vary.

In a preferred embodiment, no fields are explicitly protected from truncation as any field destined to reside in the '07' format (compressed area) is susceptible to truncation. However, as a practical matter, the most critical shipping information is rarely truncated. To avoid the loss of critical shipping information, the user program 110 is configured to store the most important destination address data in those fields that are least susceptible to truncation. Table 1 illustrates a compression priority order for data fields in accordance with one embodiment of the present invention. In this illustration, the data fields with the lowest priority are least susceptible to being truncated as part of the compression process.

TABLE 1

| Field Name | Priority | Comment |
| --- | --- | --- |
| Ship to Address Line 1 | 1 | Is intended to hold the "street" portion of the destination address |
| Ship to Address Line 2 | 2 | Is intended to hold the "room/floor" portion of the destination address |
| Ship to Address Line 3 | 3 | Is intended to hold the "department" portion of the destination address |
| Ship to Address Line 4 | 4 | Is intended to hold the "company" portion of the destination address |
| Julian Date of Pickup | 5 | Indicates the date the package was labeled. |
| Ship to Address Line 5 | 6 | Is intended to hold the "attention" portion of the destination address |
| Address Validation | 7 | Flag indicates whether the content of the ship to address was validated |
| Weight | 8 | |
| Shipment N of X | 9 | Contains package "N" of "X" total packages in a shipment |
| Shipment ID | 10 | Contains a number that identifies a shipment |

FIG. 3A shows an exemplary destination address as it might appear on a shipping label. FIG. 3B shows the same destination information reformatted by the user program 110 as an uncompressed interface string according to the data specification requirements shown in FIG. 2. If the compression priority order shown in Table 1 were applied to this example, the shipping information most susceptible to truncation by the compression process of the present invention is the "Attn: Sam Smith."

Returning to FIG. 1, the interface string from the user program 110 is sent to a compressor application 115 which compresses the destination address data and reformats the record as an ANSI-compliant label string ("label string"). The compression algorithm used in the compression application 115 is a novel modification of a traditional Huffman encoding technique. A Huffman compression algorithm assumes data files consist of some byte or character values that occur more frequently than other byte values in the same file. By analyzing data that is typical of the data to be encoded, a frequency table can be built for each character value that appears within the data. A Huffinan tree is then built from the frequency table. The purpose of the Huffinan tree is to associate a bit string of variable length with each character value in the frequency table. More frequently used characters are assigned shorter strings, while characters that appear less frequently are assigned longer bit streams. In this manner, a data file may be compressed.

The compression algorithm implemented in the compression application 115 differs from traditional compression algorithms in several important aspects. First, other compression algorithms known in the art compress at a file or record level. In contrast, the compression technique of the present invention compresses specific fields within a record. In a preferred embodiment, the compression routine predominately compresses address-type data. Secondly, the compression algorithm of the present invention does not limit the compression substitution to single character values. Instead, the compression technique described herein searches for and replaces strings of characters. In a preferred embodiment, character strings vary from one to four characters in length.

FIGS. 4A–4H show a compression substitution table in accordance with one embodiment of the present invention that associates bit strings to each of the character strings that appear in shipping destination addresses. This substitution table is the result of recursive tests run against approximately five million package label records to identify the character strings in the compression substitution table and to identify the frequency in which these character strings appear in destination addresses. More frequently used character strings were assigned shorter bit strings and less frequently used character strings were assigned longer bit strings.

To compress the data from the ANSI compliant interface string, the compressor reads in the fields in prioritized order, as dictated by Table 1. Compression of the fields occurs till the total length of the compressed string is 31 bytes. A truncation flag is set in the header, which is prepended to this stream of 31 bytes, resulting in a total of 32 bytes. The resultant 32-byte stream may contain values ranging from 0 to 255. This compressed stream is then mapped to our set of 55 possible values, resulting in a stream of 45 bytes. This is the stream which is placed in the '07' format portion of the ANSI compliant label string (output from the compressor). FIG. 5 shows a data specification for the label string outputted by the compressor application 115 in one embodiment of the present invention.

The label string is then formatted into a printable format and a shipping label that includes a MaxiCode symbol is printed. Whereas space considerations limit the amount of shipping information that can be encoded in the traditional MaxiCode symbol to city, state and zip, the compression process described above permits greater shipping detail to be encoded in the MaxiCode. In a preferred embodiment, all of the shipping destination information may be encoded in a compressed MaxiCode.

Returning again to FIG. 1, the decompression process is shown in the right column of the flow diagram. A shipping label containing a compressed MaxiCode is scanned and decoded to create an ANSI-compliant label string. The processes for scanning and decoding a two-dimensional MaxiCode symbology are well known in the art and are described in detail in one or more U.S. patents, one of which is U.S. Pat. No. 5,610,995 to Zheng et al. It will be readily apparent to one of ordinary skill in the art that the compressed MaxiCode symbol on a shipping label can be scanned and decoded using a variety of methods and the present invention is intended to encompass any and all of these. The ANSI-compliant label string is then passed to a decompressor application 120, which decompresses the label string by performing an inverse mapping of the compressed data. The decompressor application 120 outputs an ANSI-compliant interface string that, in a preferred embodiment, is identical to the original string that was inputted into the compressor application when the label was generated.

In the decompression routine, the decompressor application 120 first maps the stream of 55 values back to the compressed stream of 32 bytes containing 256 possible values (0–255 decimal). The decompressor application 120 then reverses the foregoing process by using the compression substitution table to re-build the destination address by extrapolating all of the bit strings stored in the compressed fields to their original character form. The decompressor places an '*' (42 decimal) character into any field which had been truncated, if the truncation flag is set.

B. Smart Label

Another element of the package sortation and pre-load process of the present invention is a method and system to create smart shipping labels. A smart shipping label 200, as that term is used herein, is shown in FIG. 6 and includes a routing code 210, a postal bar code 215, a service icon 220, a tracking number 225, a tracking number bar code 230 and a compressed MaxiCode 235. Much of the information encoded on the label is in machine-readable format that allows the automation of the sortation and pre-load processes.

FIG. 7 shows the architecture of a smart shipping label generation system 300 in accordance with an embodiment of the present invention. The architecture comprises a customer shipping system 310 in communication with a carrier server (hereafter a "UPS server") 315. The customer shipping system 310 may be a proprietary system of the client or may be one of several shipping systems available from third-party vendors. The customer shipping system 310 includes a client application 320 in communication with a smart label tool 325. In the preferred embodiment, the client application 320 resides on an AS/400 or Windows NT platform. But it will be readily apparent to one of ordinary skill in the art that this list of platforms is exemplary and that the smart label system may be configured to run on other platforms as well.

In a preferred embodiment, the smart label tool 325 resides at the customer site as part of the customer shipping system 310, but it should be readily apparent that the smart label tool 325 can reside on the UPS server 315 or a third-party server as well. As shown in FIG. 7, the smart label tool 325 uses a formatted output sub-system (FOSS) engine 330 to generate shipping label image files. FIG. 7 also shows the communication between the customer shipping system 310 and the UPS server 315. As described below, a customer shipping system 310 equipped with a smart label tool 325 is capable of generating a smart shipping label without accessing the UPS server 315. In a preferred embodiment, however, the customer shipping system 310 accesses the UPS server 315 on a quarterly basis to update the routing code tables that are used to generate the routing code 210 on the smart label. In addition, documentation and other software updates will reside on a UPS server website and may be accessed by the customer shipping system 310 as needed.

FIG. 8 illustrates the architecture of the smart label tool 325. The smart label tool 325 includes an application program interface (API) 350 configured to communicate with both the client application 320 and a smart label tool interface 355. In a preferred embodiment, the smart label tool interface 355 functions as a front end to control the communication between the FOSS engine 330 and the client application 320. Additional components of the smart label tool that are not illustrated in the figure are a configuration file that handles the system settings and a series of output logs that track the operation of the system and errors that occur during the process.

The following paragraphs describe the operation of the smart label tool 325. The process begins with the client application 320 sending package label data to the API 350, which, in turn passes the label data to the smart label tool interface 355. The API 350 thus functions as an interface between the customer shipping system 310 and the smart label tool 325. The smart label tool interface 355 receives the label information from the API and performs a data validation routine to confirm that the label information includes all of the elements needed to generate a smart label and/or a pickup summary barcode (PSB). If essential data is missing from the label information, an error code and a detailed report of the error are generated.

Once the system determines that the requisite label information is present, the smart label tool interface 355 passes the label data to the FOSS engine 330, which compresses the shipping destination address of the label information using the MaxiCode compression process described above. The FOSS engine 330 takes the label data as input and generates an electronic image of a smart shipping label, which is then written to the client hard-drive, where it can be printed and affixed to a package.

C. Pre-Load Assist System

Still another aspect of the package sortation and pre-load process of the present invention is the use of the compressed MaxiCode in a pre-load assist system (PAS). One of the critical stages in any parcel delivery system is the pre-load sortation of packages that occurs at a carrier destination facility. Pre-load sortation is a process in which employees of the carrier, referred to herein as pre-loaders, load packages onto delivery trucks for delivery to the ultimate destination. A carrier destination facility generally has a plurality of package cars that are being pre-loaded simultaneously. In addition, each package car is equipped with a plurality of shelves to hold the packages to be delivered.

Pre-loaders have the responsibility of ensuring that the packages are loaded on the correct shelf of the correct package car and, to date, this process has been manual. Pre-loaders physically examine the destination address on the package label and determine from memory, which package truck delivers to that address and which shelf on the truck holds the packages for that address. This is a complex task and requires that pre-loaders receive extensive training on how to properly load packages. Not surprisingly, the manual intensiveness of this pre-load process causes errors in pre-loads and increased training costs. In today's environment with high turnover rates, the increased training time negatively impacts the ability to create and sustain a workforce capable of providing quality loads.

A PAS enables simplification of the pre-load operations by providing a handling instruction for every package handled by a pre-loader. The handling instruction indicates the route (delivery vehicle) and the load position within the delivery vehicle for loading the package. FIG. 9 is a high-level diagram that illustrates the operation of a PAS according to an embodiment of the present invention. In Step 1, a package bearing a smart shipping label arrives at the carrier destination facility. The package is scanned and the destination address of the package is captured from the compressed MaxiCode symbol. In Step 2, the destination address captured from the scanning process is validated. If the validation routine returns an error, a pre-loader is prompted to review the electronically captured address against the destination address printed on the shipping label.

Once the destination address passes the validation routine without error, the process proceeds to Step 3 and the destination address is sent to the PAS tool. The PAS tool receives the destination address as input and compares the address against a dispatch plan to determine which delivery truck is assigned to deliver to the destination address and which shelf on the delivery truck will hold those packages that are delivered to that address. The PAS tool then generates a package assist label (PAL) 500.

The PAL 500 is a mechanism for conveying the pre-load handling instructions 510. FIG. 10 illustrates a PAL 500 in accordance with one embodiment of the invention. In this example, three digits on the left side of the PAL ("208") indicate the delivery vehicle and route for loading the package. The four digits that follow the hyphen ("7000") indicate the load position, sometimes known as a shelf position, within the delivery vehicle for loading the package. Other information that is present on the PAL 500 illustrated is a package tracking number 225, primary 515 and secondary 520 package sortation information, a low to high indicator 525, a commit time 530 and an irregular drop-off indicator 535. In a preferred embodiment, the primary 515 and secondary 520 sortation numbers identify the primary and secondary sortation belts for the package. The presence of this information on the PAL 500 simplifies the movement of the package to the sortation belt that delivers the package to the package car. The low to high indicator 525, indicates an order for loading a package car and in one embodiment is based on a primary street number of the package destination address. Thus, if a street range is given a handling instruction (i.e. 1–10 Main Street as R120-1888), if a low to high indicator 525 is set the packages are loaded from 1–10. On the other hand, if a load to high indicator 525 is not set, packages are loaded high to low (10–1 in this example). In one embodiment of the invention, an order is set in a dispatch plan and takes into account the direction a driver will be delivering for a particular street range. The commit time indicator 530 on a PAL 500 indicates when a package is committed for delivery at a particular time. In a preferred embodiment, a commit time may be based on the service level desired by the customer, such as Next Day Air, Second Day Air or Ground. Also in one embodiment of the present invention, the irregular drop-off indicator 535 on a PAL 500 indicates the location in the facility where irregular packages are sorted manually. Irregular packages are typically too large or too heavy or shaped in such a way that they cannot be placed on a sortation belt. In Step 4, a PAL 500 is affixed to the package and in Step 5, the package is loaded pursuant to the loading instruction on a PAL 500.

Several advantages arise from the use of a compressed MaxiCode in a PAS system. First, the pre-load operation is greatly simplified by generating handing instructions for each package in the pre-load process. The simplified presentation of handling instructions allows an inexperienced pre-loader to become productive almost immediately as the knowledge base necessary to perform the pre-load operation is reduced. Prior to the present invention, pre-loaders were required to memorize potentially hundreds of addresses to load a delivery vehicle. Using the process described above, a pre-loader can readily perform the pre-load operation relying largely on the information present on the PAL 500.

Another advantage to the compressed MaxiCode and PAS process is that a carrier had greater flexibility to update dispatch plans. Because pre-load handling instructions are based upon a dispatch plan, significant changes to a dispatch plan often result in changes to the pre-load process. In the past, because the pre-load handling instructions were knowledge based, a carrier would be limited on how often it could change its dispatch plan without disrupting the pre-load operation. By reducing the knowledge base through the generation of the package handling instructions 510 on a PAL 500, a carrier can modify its dispatch plan without negatively impacting the pre-load process. This, in turn, creates the possibility that dispatch plans can be modified dynamically to provide customized delivery times. Great flexibility thus results from the ability of a pre-load application to receive a dispatch plan and generate a scheme or plan for pre-loading. As packages arrive at a carrier facility the destination address is captured by a pre-load label application and compared against a dispatch plan, or in another embodiment against a pre-load plan, to generate handling instructions for that package. In the above-described embodiment, the handling instructions are generated on a PAL 500, but one of ordinary skill in the art will readily recognize that other methods of generating handling instructions are available. For example, in another embodiment of the present invention, package handling instructions are sent to a monitor that a pre-loader reviews as a package is loaded onto a package car.

As a result of the present invention, dispatch plans previously designed based upon dated historical data are now designed using more accurate, more recent information. In addition, the basis for dispatch plans designs are not limited to historical data and may be based at least in part on a forecast of work for the day that the dispatch plan will be executed. Thus, in an embodiment of the present invention, dispatch plans and pre-load schemes are updated daily to accommodate the work volumes anticipated for a given day. In addition, in an embodiment of the present invention, a user may adjust a dispatch plan in real-time to allow for more current data to be factored into the dispatch plan.

D. Dispatch Planning System

Dispatch plans are well known in the art and are used daily by commercial carriers. In general, the term refers to the method in which work is assigned to carrier service providers (including pickup and delivery vehicles) to allow packages to be picked up and delivered in an orderly manner. The following paragraphs describe a dispatch planning system (DPS) by which a dispatch plan is created; however, it will be readily apparent to one of ordinary skill in the art that the present invention is equally advantageous with any dispatch plan no matter what method is used to create it.

The first step in automating a pre-load operation is to electronically capture one or more dispatch plans. A DPS in accordance with the present invention creates and maintains a variety of dispatch plans. Prior to the present invention, a single dispatch plan would be created and implemented manually. Changes to a dispatch plan required careful planning and communication between a center management team in charge of the dispatch plan and a pre-load team charged with the pre-load operation. The reason for this was that changes to the dispatch plan affected a change to the delivery vehicle routes and thus necessitated changes to the pre-load handling instructions. The present invention allows a user to update or change a dispatch plan and to implement automatically that change in the pre-load operation.

One function of a DPS is to generate and publish to the PAS a dispatch plan that best reflects the anticipated volume and/or route optimizations for a given day. In a preferred embodiment, the PAS receives electronically the dispatch plans from the DPS as well as package data from a flexible data capture (FDC), which is part of the production flow system. Package data may arrive electronically via an origin package level detail (OPLD) feed into FDC or may be entered manually at a pre-load site by an operator. The PAS matches the package data to the dispatch plan and produces a PAL that is applied to each package. The PAS provides the ability to monitor the pre-load operations and make adjustments to the dispatch plan during a package sort to account for unexpected changes in sort volume or carrier staffing.

A common component in a DPS is a graphical user interface (GUI) that allows a user to easily generate a dispatch plan and compare the dispatch plan against alternative dispatch plans. Using the GUI, a DPS user can simulate different dispatching options and access a detailed comparison of two or more dispatch plans. In addition, a user can provide a sensitivity analysis to contrast multiple dispatch plans across different variable values. To illustrate, a DPS in accordance with the present invention might compare multiple dispatch plans across several cost-benefit scenarios.

In the DPS described below, GUIs are used to simplify the process of planning, assigning work and simulating dispatch plan alternatives by using a series of map overlays that allow a user to dispatch work in different combinations. In one embodiment, an operator uses the interface to simulate a variety of dispatch plans via commands and/or through "click and drag" operations.

FIG. 11 illustrates a first layer of a map overlay that represents next day air work assignments for a given geographical area. The map overlays allow a user to highlight street segments, clusters of sequence numbers or clusters of ZIP+4s and assign work to a specific driver. As the work is assigned, a variety of dispatch statistics are calculated. For example, in one embodiment, planned work hours and delivery statistics are calculated as delivery stops are assigned. Other statistics relating to dispatch may be similarly calculated as will be readily apparent to one of ordinary skill in the art. Another benefit of the system is that historical data can be used in conjunction with the interface to allow a user to estimate an expected delivery time for any set of stops in a cluster.

FIG. 12 illustrates a second layer of the map overlay for the same geographical area. This second layer represents pickup work assignments for the geographical area and a user uses this layer to assign pickup work to the drivers that service the area. Customer requests, volume availability requirements and delivery area statistics generally determine pickup work. The user assigns pickups based on these requirements and characteristics. As with the first layer, the second layer calculates dispatch statistics as work is assigned and provides a graphical representation of the pickup area. In a preferred embodiment, every pickup point, as identified by its ZIP+4, can be expanded on the screen to provide additional information, such as for example, scheduled pickup time and historical pickup time. Moreover, specific pickups that are subsequently assigned to other drivers can be specifically excluded from a route of a driver assigned to the area using this second layer.

FIG. 13 illustrates a third layer of the map overlay for the same geographical area. This third layer represents other delivery work assignments for the geographical area and a user uses this layer to assign other delivery work to the drivers that service the area. Once pickups and one-day deliveries have been assigned, the third dispatch planning layer allows the user to assign the balance of the work clusters available in the selected area as defined by a historical set of data points. In an alternative embodiment, actual ZIP+4 information (including street information or a portion thereof) that is available prior to the pre-load start time is used to develop dispatch plans rather than relying on historical or work measurement data. After cluster work assignments are completed, a user can design a trace (delivery route) manually, using existing sequence numbers as a tracing scheme. Alternatively, drives or other carrier service providers may be given the option to design a trace or, in still another embodiment, optimization algorithms may be used to enhance the trace design.

As will be readily apparent to one of ordinary skill in the art, a variety of methods for designing a trace may be used with the present invention, including manual route design, wherein a user clicks and drags from one street segment to another thereby building the trace one street at a time. Alternative methods for designing a trace include driver adjustments that allow a driver to make route adjustments and communicate the adjustments directly via the PAS, routing based on existing sequence numbers, routing optimization based on operations research algorithms or a combination of the above.

Upon completion of the dispatch planning in the third layer, DPS provides the user with final dispatch plan results including any unassigned street segments, sequence numbers, ZIP+4 clusters, final planned times and overlaps flagged as in error or needing additional revision. Once a final dispatch plan is designed, including routing detail, it is published to the PAS for execution.

FIG. 14 illustrates a fourth layer of the map overlay for the same geographical area. This fourth layer is used to evaluate dispatch plan performance and to provide feedback to the dispatch plan designer. In a preferred embodiment, the information provided by the fourth layer of the map overlay includes: actual trace of the driver (driver mapping), late next day air stops, inconsistent dispatch adjustments, send-agains after specific times, non-consecutive send-agains, pickups before a preset time, and high claim accounts.

In a preferred embodiment, historical information supporting the DPS can be used to develop special day plans and contingency plans. Further, the DPS of the present invention will allow a user to develop multiple driver level plans that can be communicated directly to the PAS based on projected package volume levels. In one embodiment, a fifth level of the map overlay is available that contains statistics aimed towards reducing service failures and improved performance. As an illustrative example, pickup and delivery stops that have a high claims history are highlighted and given special attention to avoid future claims.

FIG. 15 is a PAS process flow diagram that shows how the routing system interfaces with the address information and sequencing system to translate the routing and dispatch information into pre-load sorting and loading instructions for use in the PAS. In addition, the routing system assists in the assignment of simplified sequence identifiers, which aid in pre-load simplification. The routing system is designed to graphically illustrate a delivery vehicle shelf configuration and the destination address ranges assigned to a specific driver. In a preferred embodiment, the routing system is further configured to allow a user to make click-and-drag adjustments as needed to modify the loading and handling instructions communicated to the PAS.

The aforementioned invention, which comprises an ordered listing of selectable services can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Further, any process descriptions or blocks in flow charts should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

In concluding the detailed description, it should be noted that it will be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

The invention claimed is:

1. A method of performing a package preload operation upon a plurality of packages in accordance with a dispatch plan, wherein each of a plurality of packages has a first shipping label including a label address, said dispatch plan includes an allocation of work for a specified geographical area between and among a plurality of delivery vehicles, each of said delivery vehicles has responsibility for a service area within said geographical area, and each of said delivery vehicles includes a plurality of package load positions, said method comprising:

sending said dispatch plan to a pre-load assist system in an electronic format;

capturing electronically said a destination address from said first shipping label, wherein said destination address is based at least in part on said label address;

assigning a select vehicle from among said delivery vehicles, using said pre-load assist system, wherein said select vehicle is based at least in part on said destination address;

assigning a select load position from among said package load positions, using said pre-load assist system, wherein said select load position is based at least in part on said destination address;

generating a second shipping label that includes a handling instruction, wherein said handling instruction identifies said select vehicle and said select load position;

affixing said second shipping label to said package; and loading said package in accordance with said handling instruction.

2. The method of claim 1, wherein the step of capturing electronically a destination address comprises scanning a symbology on said first shipping label, wherein said label address is encoded within said symbology.

3. The method of claim 1, wherein the step of capturing electronically a destination address comprises scanning a compressed MaxiCode symbology, wherein said label address is encoded within said compressed MaxiCode symbology.

4. The method of claim 1, wherein the step of capturing electronically a destination address comprises interrogating a radio frequency identification tag, wherein said label address is encoded within said tag.

5. The method of claim 1, wherein the step of assigning a select vehicle comprises comparing said destination address to said service area served by one or more of said delivery vehicles.

6. The method of claim 1, wherein the step of assigning a select load position comprises selecting a shelf or shelf position on said select vehicle.

7. The method of claim 1, wherein the step of generating a second shipping label further comprises generating said second shipping label such that it includes a select vehicle identifier, a select load position identifier, and (a) a service level identifier, and/or (b) a commit time.

8. The method of claim 1, wherein the step of affixing said second shipping label comprises providing a label application device that affixes said second shipping label to said package.

9. The method of claim 1, wherein the step of loading said package in accordance with said handling instruction comprises directing said package to one or more sortation belts ultimately destined for said select vehicle.

10. The method of claim 1, further comprising:
   passing said destination address from said pre-load assist system to an address validation routine to confirm that said destination address is a valid address.

11. The method of claim 10, further comprising:
   prompting a user to review and compare said destination address against said label address printed on said first shipping label if said address validation routine returns an error.

* * * * *

UNITED STATES PATENT AND TRADEMARK OFFICE
CERTIFICATE OF CORRECTION

| | |
|---|---|
| PATENT NO. | : 7,039,496 B2 |
| APPLICATION NO. | : 10/015541 |
| DATED | : May 2, 2006 |
| INVENTOR(S) | : Perez et al. |

It is certified that error appears in the above-identified patent and that said Letters Patent is hereby corrected as shown below:

Title page,
Item (73), Assignee, "United Parcel Services of America" should read --United Parcel Service of America--.

Signed and Sealed this

Twenty-ninth Day of August, 2006

JON W. DUDAS
*Director of the United States Patent and Trademark Office*